(12) United States Patent
Cohen et al.

(10) Patent No.: US 10,460,818 B2
(45) Date of Patent: Oct. 29, 2019

(54) RETENTION-DRIFT-HISTORY-BASED NON-VOLATILE MEMORY READ THRESHOLD OPTIMIZATION

(71) Applicant: Seagate Technology LLC, Cupertino, CA (US)

(72) Inventors: Earl T. Cohen, Oakland, CA (US); Hao Zhong, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 240 days.

(21) Appl. No.: 15/472,793

(22) Filed: Mar. 29, 2017

(65) Prior Publication Data

US 2017/0206979 A1    Jul. 20, 2017

Related U.S. Application Data

(63) Continuation of application No. 14/170,008, filed on Jan. 31, 2014, now Pat. No. 9,645,177.

(Continued)

(51) Int. Cl.
| | |
|---|---|
| *G11C 16/34* | (2006.01) |
| *G11C 16/04* | (2006.01) |
| *G11C 16/26* | (2006.01) |
| *G01R 19/00* | (2006.01) |
| *G11C 29/02* | (2006.01) |

(Continued)

(52) U.S. Cl.
CPC ...... *G11C 16/3495* (2013.01); *G01R 19/0084* (2013.01); *G11C 16/0483* (2013.01); *G11C 16/26* (2013.01); *G11C 16/28* (2013.01); *G11C 16/349* (2013.01); *G11C 16/3418* (2013.01); *G11C 16/3427* (2013.01);

(Continued)

(58) Field of Classification Search
CPC ............ G01R 19/0084; G11C 16/0483; G11C 16/349; G11C 29/021; G11C 29/028; G11C 7/14
See application file for complete search history.

(56) References Cited

U.S. PATENT DOCUMENTS

| | | | | |
|---|---|---|---|---|
| 5,827,946 A | * | 10/1998 | Klee ................. | G01N 30/8651 73/23.36 |
| 6,691,053 B2 | * | 2/2004 | Quimby ............ | G01N 30/8665 435/6.12 |

(Continued)

FOREIGN PATENT DOCUMENTS

| | | |
|---|---|---|
| JP | 2009009688 | 1/2009 |
| JP | 2010505215 | 2/2010 |

OTHER PUBLICATIONS

Cohen, Earl T.; Non-Final Office Action for U.S. Appl. No. 14/170,008, filed Jan. 31, 2014, dated Mar. 24, 2016, 12 pgs.

(Continued)

*Primary Examiner* — Elias Desta
(74) *Attorney, Agent, or Firm* — Taylor English Duma LLP

(57) ABSTRACT

Methods, systems and computer-readable storage media for selecting a retention drift predictor scheme, reading retention drift history associated with reference cells of a plurality of groups of pages of a non-volatile memory (NVM), and predicting values for an optimal read threshold voltage of at least some of the plurality of groups of pages. The predicting of values for an optimal read threshold voltage may be based at least on the selected retention drift predictor scheme and the read retention drift history.

20 Claims, 9 Drawing Sheets

Related U.S. Application Data

(60) Provisional application No. 61/762,955, filed on Feb. 10, 2013.

(51) Int. Cl.
  *G11C 16/28* (2006.01)
  *G11C 7/14* (2006.01)

(52) U.S. Cl.
  CPC .......... *G11C 29/021* (2013.01); *G11C 29/028* (2013.01); *G11C 7/14* (2013.01)

(56) References Cited

U.S. PATENT DOCUMENTS

| | | |
|---|---|---|
| 8,649,212 B2 | 2/2014 | Kau |
| 2010/0309726 A1 | 12/2010 | Yang |
| 2012/0008401 A1 | 1/2012 | Katz et al. |
| 2013/0007543 A1 | 1/2013 | Goss |

OTHER PUBLICATIONS

Cohen, Earl T.; Notice of Allowance for U.S. Appl. No. 14/170,008, filed Jan. 31, 2014, dated Feb. 8, 2017, 8 pgs.
Cohen, Earl T.; Taiwan Office Action for serial No. 103104317, filed Feb. 10, 2014, dated Aug. 19, 2015, 5 pgs.
Japanese Patent Office (JPO); Office Action for Japanese patent application No. 2014-022904, filed Feb. 8, 2014, dated Jan. 16, 2018, 6 pgs.
Cohen, Earl T.; Issue Notification for U.S. Appl. No. 14/170,008, filed Jan. 31, 2014, dated Apr. 19, 2017, 1 page.
LSI Corporation; Notice of Allowance for Taiwan application No. 103104317, filed Feb. 10, 2014, dated May 3, 2017, 3 pgs.

\* cited by examiner

RETENTION-DRIFT-HISTORY-BASED NON-VOLATILE MEMORY READ THRESHOLD OPTIMIZATION

CROSS-REFERENCE TO RELATED APPLICATIONS

The present application is a continuation of U.S. non-provisional application Ser. No. 14/170,008, filed Jan. 31, 2014, now U.S. Pat. No. 9,645,177, entitled RETENTION-DRIFT-HISTORY-BASED NON-VOLATILE MEMORY READ THRESHOLD OPTIMIZATION, which claims the benefit of U.S. provisional application Ser. No. 61/762,955, filed Feb. 10, 2013, entitled RETENTION-DRIFT-HISTORY-BASED NON-VOLATILE MEMORY READ THRESHOLD OPTIMIZATION, wherein the foregoing application is incorporated by reference in its entirety for all purposes.

BACKGROUND

Field

Advancements in non-volatile storage technology are needed to provide improvements in performance, efficiency, and utility of use.

Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

Various aspects of flash memory as used by Solid State Disk (SSD) controllers will now be described in part to establish a technology background and in part to establish antecedents for nomenclature used in the balance of the specification. The minimal size of data readable by the SSD controller from Non-Volatile memory (NVM) is a "read unit" that is protected by included error correction, such as a Low-Density Parity-Check (LDPC) code. In some contexts, a read unit is referred to as a "codeword". In some embodiments, each read unit contains approximately 4 K to approximately 32 K bits of user data, plus error correction overhead. Under command of the SSD controller, those bits are read from NVM memory cells (e.g. via an array access of one or more portions of the NVM memory cells), which depending on the technology as discussed below, may hold one or more bits per cell. In some embodiments, for security reasons an SSD controller encrypts the data prior to writing the data to NVM. In some embodiments, in view of circuit design limitations with respect to long strings of identically programmed cells, an SSD controller scrambles the data prior to wiring the data to NVM.

Considered individually, each cell has a particular stored (programmed) charge that corresponds to a device threshold voltage for that cell, and further corresponds to the logical bit values being stored in the cell. While ideally all of the cells in the NVM would have identical device threshold voltages for the logical bit values stored, in practice for a variety of reasons the device threshold voltages differ across the cells is probability distributions along the device threshold voltage axis (e.g., "device threshold voltage distributions") that are similar to a Gaussian in shape.

Thus considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^{}N$ states and the same number of device threshold voltage distributions. Generally, $(2^{}N)-1$ different read thresholds (read voltage references $V_{READ1}$ through $V_{READ(N,1)}$) are required by read circuits in the NVM to distinguish between the $2^{**}N$ states.

Continuing from above, for Single-Level Cell (SLC) flash memories, N=1. SLC memories thus store one-bit per cell of storage, have two device threshold voltage distributions (one for zeroes and another for ones), and require a single read threshold, read voltage reference $V_{READ1}$. From lower to higher device threshold voltages, the two device threshold voltage distributions are known as the E (Erased) state and D1 (first Data) state. While arbitrary, a common mapping (coding) is to assign logical one to the E state and logical zero to the D1 state. Thus references to zeroes and ones are proxy references for respective decodings of the D1 state and the E state.

Continuing further from above, for Multi-Level Cell (MLC) flash memories, N>1. MLC memories thus store more than one bit per cell, have more than two device threshold voltage distributions, and require multiple different read thresholds to distinguish the distributions. For example, a 4LC memory (e.g. flash memory) stores two bits per cell, has four device threshold voltage distributions, and generally requires three read thresholds (read voltage references $V_{READ1}$, $V_{READ2}$, and $V_{READ3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped addressed) in accordance with a particular binary sequence, such as a Gray code sequence. Thus references to one or more of the 11, 10, 00, and 01 states, are proxy references for respective decodings of the E, D1, D2, and D3 states.

With respect to address mapping used for the states of an MLC, each can be said to have a Most Significant Bit (MSB) and a Least Significant Bit (LSB) (and for more than two bits per cell, bits of significance in between). While there are various ways that MLC NVMs program their cells, the following approach is common. An initial programming round (a manipulation of the charge distributions) establishes the LSB, e.g., writes the "lower pages". This is done loosely in the same manner as for writing an SLC, e.g., a charge manipulation that establishes the E state device threshold voltage distribution and a second state device threshold voltage distribution. Depending on the binary sequence used, the second state device threshold voltage distribution is similar to the D1 state device threshold voltage distribution, similar to the D2 slate device threshold voltage distribution, or between the D1 and D2 state device threshold voltage distributions. For MLC, one or more additional programming rounds further manipulate the device threshold voltage distributions (in number, location along the device threshold voltage axis, and in shape), as required per the number of levels of the MLC. More particularly, one or more subsequent programming operations write the "middle pages" (if any, for more than two bits per cell), and a last programming operation establishes the MSB, e.g., writes the "upper pages". For example in a 4LC (2-bit per cell MLC), the E distribution and the second distribution of the first program round are respectively bifurcated by a second program round into E and D1 distributions and D2 and D3 distributions.

The device threshold voltage distributions are modified away from their initial/nominal distributions by one or more factors, such as read disturb, write disturb, and retention loss. More particularly, over time, temperature, and other factors related to use, the location of each of the device threshold voltage distribution can move around with respect to the device threshold voltage mos. Such changes increase the likelihood of read errors that are performed using a read reference voltage value for the read threshold that was previously established based on the nominal device threshold voltage distribution. In some SLC embodiments, when a hard-decision uncorrectable error is encountered in a read unit read from NVM, a series of retry operations is performed to recover the read unit. The retry operations include the controller re-reading the read unit at different voltage values of the read threshold $V_{READ1}$, such as determined by a register setting written via an I/O command from the SSD controller. By reading at different settings of the read threshold $V_{READ1}$, the read unit is sampled at different points on the device threshold voltage axis in an attempt to locate a sample of the read unit that is (hard-decision) correctable.

One algorithm suggested by NVM vendors is sweeping the SLC read threshold slowly upwards (increasing the read reference voltage $V_{READ1}$ from its nominal value) in an attempt to find a sample of the read unit that is correctable. If this procedure fails, then the read threshold is swept in another direction (decreasing the read reference voltage $V_{READ1}$ from its nominal value). If both sweeps fail, then the read unit is uncorrectable (by hand-decision decoding). Linearly sweeping the read threshold, which might have 16 to 64 steps at different respective read reference voltage settings, requires many time-consuming samples of the read unit (each with an attendant recovery time latency). Even when such a search is infrequently required, and thus not a major impact on average latencies, for applications with strict maximum latency requirements, including some database applications, such a time-consuming search is unacceptable.

SYNOPSIS

The invention may be implemented in numerous ways, including as a process, an article of manufacture, an apparatus, a system, a composition of matter, and a computer readable medium such as a computer readable storage medium (e.g., media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media to accordance with the concepts described herein. As is discussed in more detail in the Conclusions, the invention encompasses all possible modifications and variations within the scope of the issued claims.

In some embodiments and/or usage scenarios, read thresholds are adjusted independently of detection of uncorrectable (e.g. hard-decision decode) errors, such as via retention drift tracking, a.k.a. a retention drift clock, technique that proactively manages read thresholds as described below. The independent adjustment of read thresholds enables, in some contexts, avoiding uncorrectable errors that would otherwise occur without the independent adjustment. In various embodiments, a read threshold adjustment of an NVM is determined any one or more of: at manufacture of the NVM, at initial use of the NVM (e.g. a first SSD boot), at one or more times (e.g. periodically, irregularly, or randomly), in response to a bit error rate that is above a threshold, and in response to meeting a condition (e.g. exceeding a target BER, or exceeding a target disparity in the zero/one balance).

In various embodiments, blocks of the NVM are managed in groups, and each of a sampling of the blocks of a particular one of the managed groups is at least partially read. If at least some of the partial read sample blocks meet the condition, then the read threshold is adjusted for all of the blocks of the particular managed group. In various embodiments, the adjusting is via a retention drill clock (retention drift tracking) technique.

A retention drill clock uses one or more reference pages (or ECC units or blocks) on one or more NVM die as read threshold over time/temperature references, and uses a function of those values as a measure of drift (over time/temperature). At some initial time, the one or more reference pages are programmed (along with other pages in the same block so that these pages behave as others), and an initial read threshold is measured for each of the one or more reference pages. In some embodiments, read threshold values are averaged among one or more of: all reference pages on the same die; and all reference pages in the same one or more die in an I/O device.

DESCRIPTION OF DRAWINGS

FIGS. 2A and 2B are SLC specific, respectively illustrating device threshold voltage distributions at a first and a later second time. FIGS. 2C and 2D are MLC specific, respectively illustrating device threshold voltage distributions at a first and a later second time.

LIST OF REFERENCE SYMBOLS IN DRAWINGS

Figure 1A:
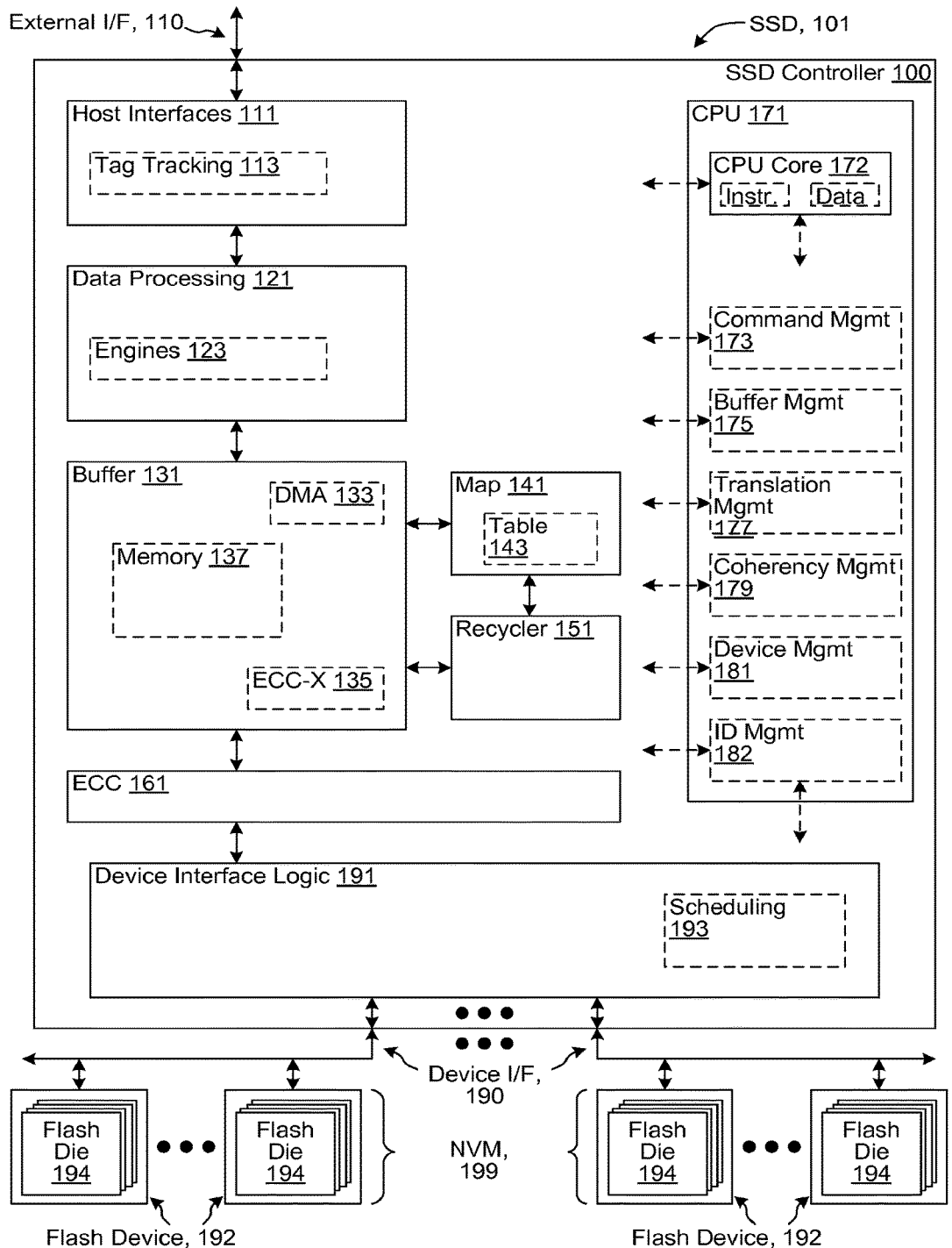
FIG. 1A illustrates selected details of an embodiment of a Solid-State Disk (SSD) including an SSD controller that implements optimization of read thresholds for managing Non-Volatile Memory (NVM) elements (e.g., flash memories).

| Ref. Symbol | Element Name |
|---|---|
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |
| 107D | dotted-arrow (Host Software ←→ I/O Device Communication) |
| 109 | Application |
| 109D | dotted-arrow (Application ←→ I/O Device Communication via driver) |
| 109V | dotted-arrow (Application ←→ I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 131 | Buffer |
| 133 | DMA |
| 135 | ECC-X |
| 137 | Memory |
| 141 | Map |
| 143 | Table |
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 210 | SLC Nominal Read Threshold |
| 215 | SLC Adjusted Read Threshold |
| 220 | SLC Nominal Most-Negative Threshold State |
| 225 | SLC Adjusted Most-Negative Threshold State |
| 230 | SLC Nominal Most-Positive Threshold State |
| 235 | SLC Adjusted Most-Positive Threshold State |
| 240 | MLC Nominal First Read Threshold |
| 242 | MLC Nominal Second Read Threshold |
| 244 | MLC Nominal Third Read Threshold |
| 250 | MLC Nominal Most-Negative Threshold State |
| 251 | MLC Adjusted Most-Negative Threshold State |
| 260 | MLC Nominal Next-Most-Negative Threshold State |
| 261 | MLC Adjusted Next-Most-Negative Threshold State |
| 265 | MLC Adjusted First Read Threshold |
| 270 | MLC Nominal Next-Most-Positive Threshold State |
| 271 | MLC Adjusted Next-Most-Positive Threshold State |
| 275 | MLC Adjusted Second Read Threshold |
| 280 | MLC Nominal Most-Positive Threshold State |
| 281 | MLC Adjusted Most-Positive Threshold State |
| 285 | MLC Adjusted Third Read Threshold |
| 306 | Write Data |
| 310 | Scrambler |
| 311 | Scrambled Write Data |
| 320 | ECC Encoder |
| 321 | ECC Encoded Write Data |
| 332 | NVM Array |
| 334 | Programmable Read Voltage Circuitry |
| 336 | Control/Status Registers |
| 338 | I/O |
| 340 | Imbalance Detector |
| 341 | Imbalance |
| 351 | Read Data |
| 359 | Uncorrected & Scrambled (Raw) Read Data |
| 360 | ECC Decoder |
| 361 | Corrected Read Data |
| 362 | Uncorrectable Read |
| 370 | Descrambler |
| 371 | Unscrambled Read Data |
| 380 | Balance Restoration Logic |
| 410 | Scramble Data |
| 420 | ECC Encode |
| 430 | Write NVM |
| 440 | Read NVM |
| 450 | Data Recovery |
| 460 | Uncorrectable Error Evaluation |
| 470 | Disparity Determination |
| 480 | Read Threshold Adjustment |
| 501 | Write Reference Cells |
| 502 | Determine Actual New Optimal Read Thresholds |
| 503 | Initialize Retention Drift History |
| 510 | Initialize Current Rd. Thresholds to Default Operating Rd. Thresholds |
| 520 | Read With Current Read Thresholds |
| 530 | Update Current Read Thresholds |
| 540 | Minor Retention Drift Update |
| 541 | Read Random Blocks with Current Read Thresholds |
| 542 | Meets Condition? |
| 543 | Read With Sample Read Thresholds |
| 544 | Estimate New Device Threshold Voltage Distributions |
| 545 | Calculate New Operating Read Thresholds |
| 546 | Update Current Read Thresholds With New Operating Read Thresholds |
| 550 | Decision: Timer (T1) Expired? |
| 551 | Decision: Timer (T2) Expired? |
| 552 | Start Retention Drift Update |
| 553 | Select Retention Drift Predictor/Scheme |
| 554 | Read Retention Drift History |
| 555 | Predict New Optimal Read Thresholds Based on Retention Drift History |
| 556 | End Minor Retention Drift Update |
| 561 | Start Major Retention Drift Update |
| 562 | Review Retention Drift History |
| 563 | Decision: Epoch Should End? |
| 564 | Write Reference Cells |
| 565 | Note New Epoch in Retention Drift History |
| 566 | Determine Actual New Optimal Read Thresholds |
| 567 | Update Retention Drift History |
| 568 | End Major Retention Drift Update |
| 560 | Major Retention Drift Update |
| 570 | Implement Epochs |
| 590 | Retention Drift Tracking (a.k.a Retention Drift Clock) |
| 600 | MLC Old Most-Negative Threshold State |
| 601 | MLC Old Next-Most-Negative Threshold State |
| 602 | MLC Old Next-Most-Positive Threshold State |
| 603 | MLC Old Most-Positive Threshold State |
| 610 | MLC Old First Read Threshold |
| 611 | MLC Old Second Read Threshold |
| 612 | MLC Old Third Read Threshold |
| 620 | MLC New Most-Negative Threshold State |
| 621 | MLC New Next-Most-Negative Threshold State |
| 622 | MLC New Next-Most-Positive Threshold State |

-continued

| Ref. Symbol | Element Name |
|---|---|
| 623 | MLC New Most-Positive Threshold State |
| 630 | First of First Set of LSB Sample Read Thresholds |
| 631 | Second of First Set of LSB Sample Read Thresholds |
| 632 | Third of First Set of LSB Sample Read Thresholds |
| 640 | First of Second Set of LSB Sample Read Thresholds |
| 641 | Second of Second Set of LSB Sample Read Thresholds |
| 642 | Third of Second Set of LSB Sample Read Thresholds |
| 650 | MLC New First Read Threshold |
| 651 | MLC New Second Read Threshold |
| 652 | MLC New Third Read Threshold |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety or word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not necessarily obscured.

INTRODUCTION

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

At least some of the various shorthand abbreviations (e.g. acronyms) defined here refer to certain elements used herein.

| Acronym | Description |
|---|---|
| AES | Advanced Encryption Standard |
| AHCI | Advanced Host Controller Interface |
| API | Application Program Interface |
| ASCII | American Standard Code for Information Interchange |
| ATA | Advanced Technology Attachment (AT Attachment) |
| BCH | Bose Chaudhuri Hocquenghem |
| BER | Bit Error Rate |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DES | Data Encryption Standard |
| DMA | Direct Memory Access |
| DNA | Direct NAND Access |
| DRAM | Dynamic Random Access Memory |
| DVD | Digital Versatile/Video Disk |
| DVR | Digital Video Recorder |
| ECC | Error-Correcting Code |
| eMMC | Embedded MultiMediaCard |
| eSATA | external Serial Advanced Technology Attachment |
| GPS | Global Positioning System |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LB | Logical Block |
| LBA | Logical Block Address |
| LDPC | Low-Density Parity-Check |
| LFSR | Linear Feedback Shift Register |
| LPN | Logical Page Number |
| LSB | Least Significant Bit |
| LZ | Lempel-Ziv |
| MLC | Multi-Level Cell |
| MMC | MultiMediaCard |
| MPEG | Moving Picture Experts Group |
| MSB | Most Significant Bit |
| NAS | Network Attached Storage |
| NCQ | Native Command Queuing |
| NVM | Non-Volatile Memory |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| PHY | PHYsical interface |
| POS | Point Of Sale |
| RAID | Redundant Array of Inexpensive/Independent Disks |
| RASIE | Redundant Array of Silicon Independent Elements |
| ReRAM | Resistive Random Access Memory |
| RS | Reed-Solomon |
| RSA | Rivest, Shamir & Adleman |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SDR | Single-Data-Rate |
| SLC | Single-Level Cell |
| SMART | Self-Monitoring Analysis and Reporting Technology |
| SSD | Solid-State Disk/Drive |
| TCG | Trusted Computing Group |
| UFS | Unified Flash Storage |
| USB | Universal Serial Bus |
| VF | Virtual Function |
| WAN | Wide Area Network |

Tracking and Restoring Zero/One Balances

The initial discussion that follows, of tracking and managing counts for zeros and ones and the shifting of the read threshold used to distinguish the zero and one states, is directly applicable to SLC memories and (with minor variation, as noted) to the lower pages of MLC memories. More generally with respect to MLC memories, extension to tracking and managing counts for upper pages and the shifting of multiple read thresholds (e.g., read voltage references $V_{READ1}$, $V_{READ2}$, and $V_{READ1}$) is detailed in separate paragraphs below.

In some embodiments, a zero count and a one count are obtained for each read unit (or each group of read units transferred at one time from one NVM die) read from an SLC NVM. In an event that the read unit is uncorrectable (e.g. in a context of hard-decision decoding) in part due to the shift in the device threshold voltage distributions away from their (initial) nominal distributions, the zero count and/or the one count enable a determination of a direction and/or a magnitude to move (set) a read threshold to track the shift in the device threshold voltage distributions and restore the zero/one balance. The read threshold being adjusted is read voltage reference $V_{READ1}$ for SLC memories and read voltage reference $V_{READ2}$ for the lower pages of MLC memories. For example, in an SLC having a logical one assigned to the erase state, and written with a known statistically equal (50-50 percent, a.k.a. 50/50 percent, or simply 50/50) distribution of zeroes and ones, if a current zero/one counts indicates a predominance of ones, $V_{READ1}$ is shifted lower; and if the current zero/one counts indicates a predominance of zeroes, $V_{READ1}$ is shifted higher (Substitute $V_{READ2}$ for $V_{READ1}$ in the foregoing example, for the lower pages of MLC memories.) A magnitude of how much to change (shift) the read threshold is optionally determined by a percentage of a number of zeroes (or ones). The magnitude is based on one or more of: the number of zeroes and/or ones observed in one or more samples; a read threshold increment of the one or more samples; a knowledge of predicted device threshold voltage distribution corresponding to a midpoint between the peaks of the two distributions; programs/erase count (wear); read disturb counts; retention time; and other similar factors.

Finding the Read-Equilibrium Point

In further embodiments, a binary-search-like operation (iteratively sampling the same read unit at respective values of the appropriate read voltage reference) is used to find a read threshold "read-equilibrium point". This is a point on the device threshold voltage axis between adjacent devise threshold voltage distributions resulting in raw data (pre error correction) statistical state distributions that upon reading, match within a statistical margin of error to the statistical state distributions written, or idealized models of same.

For SLC memory and random scrambling, such as resulting from encryption, the read-equilibrium point is the read threshold (read voltage reference $V_{READ1}$) where a zero/one balance (of the raw data read from the NVM) is most even (near identical). Under such conditions, the two state distributions have a 50-50 balance. I.e., 50% of the states read are zeroes and 50% of the states read are ones. (Substitute $V_{READ2}$ for $V_{READ1}$ in the foregoing for the lower pages of MLC memories.)

In some embodiments, the read-equilibrium point corresponds to one or more of: a center point between two voltage distributions, a minima between two voltage distributions, a point at which the zero/one balance in read data is closest to 50-50, and a point determined according to interpolation of the zero/one balance found at two other points. The read equilibrium point corresponds to a center-point between the adjacent device threshold voltage distributions in embodiments having symmetric adjacent device threshold voltage distributions.

Finding and setting the read threshold to the desired read-equilibrium point reduces the number of reads required to find an optimal point at which to attempt hard-decision decoding. In still further embodiments, hard-decision decoding is attempted at each read threshold sampling point (each value of $V_{READ1}$ for SLC memories, or each value of $V_{READ2}$ for the lower pages of MLC memories) in the binary search in the event a "good enough" read threshold is found before the read threshold read-equilibrium point is found. The search is generally truncated upon finding the good enough read threshold, except as discussed below regarding possibly taking additional sampling around the determined read-equilibrium point for soft-decision decoding purposes. In various embodiments, the "good enough" read threshold results in successful hard decision decoding of the raw read data. In some embodiments, a magnitude of the search steps (the read threshold increment) in the binary search is determined (based), at least in part, on various factors as detailed above regarding the magnitude of the read threshold change.

MLC Considerations

In MLC memories, multiple read thresholds are managed. In some embodiments, this is performed by assuming uniform displacements of the multiple device-threshold-voltage distributions and changing all other read thresholds based on decisions made for the first read threshold ($V_{READ1}$) based on a read data zero/one balance of the lower pages.

For a 4LC NVM, theoretically there is an 11/10/00/01 balance of 25-25-25-25 (in contrast to a zero/one balance of 50-50). However, there is no single operation that directly provides this balance, given that 4LCs are generally read via separate array accesses using the three read voltage references: $V_{READ2}$ for lower pages and $V_{READ1}$ and $V_{READ3}$ for upper pages. One could thus evaluate two respective zero/one balances: between the D1 and D2 states for lower pages, and between the E and D1 states combined with between the D2 and D3 states for upper pages. Alternatively, one could carry out three separate lower-page-like array accesses setting the single lower-page read threshold to values near each of $V_{READ1}$, $V_{READ2}$, and $V_{READ3}$.

By way of example, in some 4LC NVM embodiments, read voltage references $V_{READ1}$, $V_{READ2}$, and $V_{READ3}$ may need shifting, at least for one of the two bits stored in the cell. Working similarly to the SLC case, one of the two bits stored in the cell requires a single array access at a first read threshold ($V_{READ2}$, in this MLC case). Ascertaining the other bit requires two additional read thresholds ($V_{READ1}$, and $V_{READ3}$, and effectively two associated respective additional array accesses that are performed internally by the NVM).

According to various embodiments, either: the two read thresholds ($V_{READ1}$ and $V_{READ3}$) for the other bit are moved in unison by a same and/or a differing amount (under a presumption that drift is similar for both states); or the two read thresholds for the other bit are moved independently (at a cost in additional read operations). The latter option requires knowing the state of the SLC-like bit in the cell (the LSB), as the state of the SLC-like bit determines which of the two read threshold ($V_{READ1}$ and $V_{READ3}$) are used for ascertaining the corresponding other bit (the MSB).

In some 4LC embodiments, a combined "upper page" read data zero/one balance is evaluated for a simultaneous blend of the E and D1 distributions and the D2 and D3 distributions. Based on disparities in the combined zero/one balance read vs. that written, and in view of the bit sense reversal (1 to 0 for moving from E to D1, and 0 to 1 for moving from D2 to D3), the corresponding two read thresholds ($V_{READ}1$ and $V_{READ}3$) are moved in unison in opposite directions. This is done such that the zero/one balance of each component of the blend moves "in the same direction" (e.g., the movements do not conflict).

In some 4LC embodiments, the movement of the two upper page read thresholds ($V_{READ1}$ and $V_{READ3}$) are separately determined respective evaluations of zero/one balance for the upper page while using a respective LSB for each bit of the read unit. When the LSB=1, the direction of movement is the opposite of that of the LSB=0 case. For example, instead of computing a disparity between a zero count and a one count in upper page read data, an upper page disparity is computed by selectively modifying each bit of upper page read data based on a corresponding bit of lower page read data, converting a sense of the bits of the upper page read data front a numeric value to a directional value where, for example, 0 represents a higher device threshold voltage and 1 represents a lower device threshold voltage. In some embodiments, an XNOR of the bits of the upper page read data and the corresponding bits of the lower page read data performs the converting.

Removing Bias from Soft-Decision Samples

In some embodiments, soft decision information is obtained from NVM to perform soft-decision based decoding. The soft decision information is obtained by reading a read unit (or each group of read units transferred at one time from one NVM die) at a variety of read threshold sampling points (for an SLC, values of $V_{READ1}$) about the nominal (unadjusted) read threshold to obtain multiple samples of data of the read unit, thus building up a soft-decision likelihood of a value of each bit of the read unit. A spacing of the samples depends, at least in part, on particular properties of the NVM used, such as its nominal separation of charge states.

The soft-decision information is biased, however, unless the nominal read threshold about which the samples are taken is a read threshold read-equilibrium point (as described above). If the current read threshold is not the threshold read-equilibrium point, then all the soft-decision information is biased in one direction or the other. Following are two example techniques to adjust for this and obtain unbiased (or at least less-biased) soft-decision information.

1. Since a zero/one balance of the read unit as sampled at each of the read threshold sampling points is readily identified, the read threshold read-equilibrium point is readily determined (according to embodiment, such as by using linear interpolation). An offset is calculated corresponding to the difference between the determined read threshold read-equilibrium point and the (old, unadjusted) nominal read threshold. Previously determined soft-decision information is enabled to be properly "re-centered" and still used by applying the offset with respect to the voltages at which the soft-decision information was previously sampled (with values larger than 1.0 or less than 0.0 being truncated). This approach requires no additional reads, but produces a differing amount of precision/accuracy for some of the data.

2. Since a zero/one balance of the read unit as sampled at each of the read threshold sampling points is readily identified, after collecting all required samples, the read threshold sampling point closest to the read threshold read-equilibrium point is readily determined. The closest is the read threshold sampling point with the zero/one balance most proximate to the zero/one balance written. For the SLC encryption (or scrambling) case, it is the read threshold sampling point closest to having a 50-50 balance. As all of the samples nominally have equivalent spacing from each other, the closest sample is chosen as a new nominal read threshold, and additional soft-decision information samples are optionally gathered (assuming the new nominal read threshold differs from the old). Alternatively, a binary search to find the threshold read-equilibrium point is done first, with precision of the binary search limited to a finest granularity of sampling required for the desired precision or the soft-decision information. The desired precision of the soft-decision information has an associated sample window around the new nominal read threshold. Doing a binary search as a part of multiple reads needed to obtain soft-decision information requires no additional reads, unless the old nominal read threshold falls outside the desired precision sample window.

In the SLC encryption embodiments described so far, the above techniques have focused on finding a preferred read threshold that yields a read data zero/one balance that is closest to 50-50. For cases where the device threshold voltage distributions are of generally the same symmetric shape and do not substantively overlap, this preferred read threshold would also correspond to the minima of the combined device threshold voltage distributions.

Read Threshold Interpolated from Known Points on the Device Threshold Voltage Distributions In some embodiments, another approach to finding the preferred read threshold is to instead find two points, one on each adjacent device threshold voltage distribution, and determine the midpoint between these two points by interpolation. For example, sampling at the peak of each device threshold voltage distribution should yield a 75/25 balance of read data zeroes/ones (or ones/zeroes, depending on which peak). Once the two peaks are identified, the calculated midpoint between the two on the device threshold voltage axis is used to set a new read threshold.

If it is known a priori that the device threshold voltage distributions are not uniform (e.g., asymmetrically biased on one side or the other, such as by having a long tail), then in some embodiments that information is used to interpret the position of the peak and to locate the center by a slightly more complex interpolation (e.g., not just the midpoint). Factors such as retention time and/or wear may influence the symmetry of the device threshold voltage distributions and are accounted for in some embodiments. Multiple sampling points are also used in some embodiments to reveal the shape of the device threshold voltage distributions.

In some embodiments where the range of device threshold voltage adjustment is limited, it may not be possible to find the true peak. In particular, the device threshold voltage cannot be moved less than 0 V with some flash devices even though the voltage distribution of the E state extends into negative device threshold voltages. Knowledge of the device threshold voltage distribution still permits the midpoint to be determined via interpolation. For example, if at 0 V the read data zero/one balance is 60/40, then approximately 10% excess zeroes are being observed and an area of the E distribution to the right of 0 V is approximately 10%. In a first approach of some embodiments, the peak of the D1 distributions is found, and the midpoint is interpolated based on knowledge of the approximate shape of the E distribution. In a second approach of some embodiments, the point of the D1 distribution at which the read data zero/one balance is 40/60 (the opposite point from the 0 V measurement) is found. The calculated midpoint between the 60/40 and the 40/60 observations is then used to set the new preferred read threshold. The calculated midpoint could be determined with greater precision with additional knowledge and/or measurement of the two device threshold voltage distributions.

In some embodiments, the points being interpolated are both on a same side as the read equilibrium point. For example, knowing that a first read threshold sampling point X yields 75/25 read data zero/one balance and a second read threshold sampling point Y yields 62.5/37.5, the read equilibrium point would be close to $Y\pm(X-Y)$ where '+' vs. '−' depends on whether Y is less than X. The direction of the read equilibrium point is the direction corresponding to moving from the read data zero/one balance closer to 50/50. In the example given, that is in the direction from X and toward Y. Knowledge of the device threshold voltage distributions would yield a more accurate interpolation rather than the simple linear interpolation indicated.

Retention Drift Tracking

In various embodiments and/or usage scenarios, the device threshold voltage distributions in an NVM shift over time and cause a read error (e.g. when hard-decision decoding). As the device threshold voltage distributions shift, values that were previously below (or above) a certain read threshold, full above (or below) the certain read threshold and cause a bit error. E.g. a value previously stored as (and considered to be in) the D1 distribution, is determined to be in the D2 distribution, thus resulting in a bit error. A small number of bit errors are correctable; however a sufficient number of bit error causes an uncorrectable (e.g. hard-decision decode) error. In some embodiments and/or usage scenarios, an uncorrectable (e.g. hard/decision decode) error that would otherwise occur is avoidable via proactive adjustment of read thresholds, such as via retention drift tracking that adjusts the read thresholds independently of uncorrectable error detection.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
in accordance with programming a particular one of a plurality of groups of pages of a non-volatile memory, recording a sampled value of a voltage drift reference timestamp as of the time of the programming; and
in accordance with reading subsequent to the programming some or all of the particular group of pages, determining a voltage threshold of the reading based at least in part on the recorded sampled value of the voltage drift reference timestamp and the sampled value of the voltage drift reference timestamp as of the time of the reading.

EC2) The method of EC1, wherein the sampled values of the voltage drift reference timestamp are according to a voltage threshold of a reference location of the non-volatile memory.

EC3) The method of EC1, further comprising using a default voltage threshold as the voltage threshold of the reading when the recorded sampled value of the voltage drift reference timestamp and the sampled value of the voltage drift reference timestamp as of the time of the reading differ by less than a specified difference.

EC4) The method of EC1, further comprising:
periodically sampling a reference location of the non-volatile memory to determine a current voltage threshold of the reference location; and
wherein the periodically sampling determines, at least in part, the sampled values of the voltage drift reference timestamp.

EC5) The method of EC4, wherein the reference location is a page of the non-volatile memory.

EC6) The method of EC4, wherein the reference location is one of the pages of the particular group of pages.

EC7) The method of EC4, wherein the reference location is in a new block of the non-volatile memory as at least one of the pages of the particular group of pages.

EC8) The method of EC4, wherein each of the sampled values of the voltage drift reference timestamp comprises a respective generation number and a respective threshold portion, the generation number according to a master generation number, and the threshold portion according to the current voltage threshold of the reference location as of the associated periodically sampling.

EC9) The method of EC7, further comprising when the current voltage threshold of the reference location exceeds a bound, updating the reference location, and incrementing the master generation number.

EC10) A method comprising:
writing a block, as part of a normal (non-system-reference) block write, with normal data pages and one or more system reference pages;
as a background system mask and in anticipation of normal page reads from the block, periodically determining an optimal read threshold voltage for the block based at least on system reads of the one or more system reference pages; and
performing a normal page read, of the anticipated normal page reads, using the predetermined optimal read threshold voltage for the block.

EC11) A method comprising:
writing a plurality of pages of non-volatile memory organized at least in groups of pages, the plurality of pages written comprising normal (non-system-reference) pages and one or more system reference pages for use at least in part in tracking read threshold voltage shifts;
in accordance with a first timing and first optimization criteria, for each of the system reference pages, repeatedly determining an optimal reference-page read threshold voltage;
in accordance with a second timing and second optimization criteria, for each group, repeatedly determining an optimal reference-group read threshold voltage as a function of at least the most recently determined reference-page read threshold voltages; and for at least one normal page, of the normal pages, to be read on-demand, reading the at least one normal page using an on-demand read threshold voltage dynamically selected, at least in part based on the group the page to be read corresponds to, from the most recently determined optimal reference-group read threshold voltages.

EC12) The method of EC11, further comprising:
detecting that on of the optimal reference-page read threshold voltages is out of tolerance and reprogramming the system reference page corresponding to the detected out of tolerance optimal reference-page read threshold voltage.

EC13) The method of EC11, further comprising:
in accordance with a third timing, for each system reference page, repeatedly evaluating whether the determined optimal reference-page read threshold voltage has shifted excessively (greater than a programmable/configurable value), and based on the evaluating, reprogramming the system reference page and incrementing a respective reference-page-generation count; and
storing at least some of the determined read threshold voltages encoded as a first field in a storage representation further composing a second field encoding the reference-page-generation count associated with the first field.

EC14) The method of EC11, wherein the on-demand read threshold voltage is shifted relative to the threshold voltage used when the page to be read was last written.

EC15) A method of EC11, wherein at least some of the determined read threshold voltages are stored as an encoded plurality of bits.

EC16) The method of EC11, wherein at least some of the determined read threshold voltages are stored as an encoded plurality of bits using a mapping to provide greater resolution of representation in at least some regions of read threshold voltage operation associated with rapid shifts in value.

EC17) The method of EC11, wherein at least some of the determined read threshold voltages are stored encoded as a first field in a storage representation further comprising a second field identifying a reference-page-generation associated with the first field.

EC18) The method of PC17, wherein the reference-page-generation field distinguishes among a succession of different reference pages.

EC19) The method of EC17, wherein the reference-page-generation field distinguishes among a succession of reprogrammings of the same reference page.

EC20) The method of EC17, wherein the first field and second field respectively comprise the least significant bits and most significant bits of the storage representation.

EC21) The method of EC11, wherein the system reference pages comprise at least one of ECC units and ECC blocks.

EC22) The method of EC11, wherein the first timing and the second timing are the same.

EC23) The method of EC11, wherein the first timing and the second timing are different.

EC24) The method of EC11, wherein at least one of the first timing and the second timing are modified in accordance with a determination that the read threshold voltage shift has entered a less-linear region of operation.

EC25) The method of EC11, wherein at least one of the first timing and the second timing compromise adaptive timing in an attempt to sample in proportion to a rate of change of one of the read threshold voltages.

EC26) The method of EC11, wherein at least one of the first timing and the second timing comprise timing based at least in part on a selected nominal interval of once a day, once a week, or once a month.

EC27) The method of EC11, wherein at least one of the first timing and the second timing comprise timing based at least in part on one or more of a type of non-volatile memory, a history of a rate of change of one of the read threshold voltages, temperature, and elapsed time.

EC28) The method or EC11, wherein at least one of the first timing and the second timing comprise timing based at least in part on one or more of power-on events, reset events, and wake-up events.

EC29) The method of EC11, wherein reading benefits from the prior determining of the optimal reference-group read threshold voltage without incurring a latency associated with the prior determining.

EC30) The method of EC11, wherein the page read on-demand is a selected one of: a) a system page, other than the system reference pages; b) a non-system page; and c) a user page.

EC31) The method of EC11, wherein the system reference pages reside on one or more die of the non-volatile memory.

EC32) The method of EC11, wherein the on-demand read threshold voltage is an average of all reference pages on a same die of the non-volatile memory.

EC33) The method of EC11, wherein the on-demand read threshold voltage is an average of all reference pages on one or more die of the non-volatile memory.

EC34) The method of EC11, wherein the non-volatile memory is composed on one or more die of an I/O device.

EC35) The method of EC34, wherein the I/O device is a storage device.

EC36) The method of EC34, wherein I/O device is a solid-state-drive (SSD).

EC37) The method of EC34, wherein the on-demand read threshold voltage is a die-averaged value.

EC38) The method of EC34, wherein the on-demand read threshold voltage is an I/O-device-averaged value.

EC39) The method of EC11, wherein the determined optimal reference-page read threshold voltage is a read threshold voltage that minimizes read errors.

EC40) The method of EC11, wherein the determined optimal reference-page read threshold voltage is a read threshold voltage that best produces (enables results matching within a predetermined/programmable/configurable error bound of) a distribution used in the programming.

EC41) The method of EC11, wherein the programming used encryption and the determined optimal reference-page read threshold voltage is a read threshold voltage that produces a 50-50 balanced distribution of 0's and 1's.

EC42) The method of EC11, wherein the group is an R-block.

EC43) The method of EC11, wherein the reading is compensated for read threshold voltage shifts that are a fraction of at least one or more at retention time and retention temperature.

EC44) A method comprising:
recording a sampled value of a voltage drift reference timestamp associated with programming a particular one of a plurality of groups of pages of a non-volatile memory; and
determining a voltage threshold, of a reading of at least some of the particular group of pages programmed, based at least in part on the recorded sampled value of the voltage drift reference timestamp and a sampled value of the voltage drift reference timestamp associated with the reading.

EC45) The method of EC44, wherein the sampled values of the voltage drift reference timestamp are according to a voltage threshold of one or more reference locations of the non-volatile memory.

EC46) The method of EC44, further comprising: subsequent to the recorded sampled value of the voltage drift reference timestamp differing by less than a specified difference with respect to the sampled value of the voltage drift reference timestamp as of a time of the reading, using a default voltage threshold as the voltage threshold of the reading.

EC47) The method of EC44, further comprising:
periodically sampling a reference location of the non-volatile memory to determine a current voltage threshold of the reference location; and
wherein the periodically sampling determines, at least in part, the sampled values of the voltage drift reference timestamp.

EC48) The method of EC47, wherein the reference location is a page of the non-volatile memory.

EC49) The method of EC47, wherein the reference location is one of the pages of the particular group of pages.

EC50) The method of EC47, wherein the reference location is in a same block of the non-volatile memory as at least one of the pages of the particular group of pages.

EC51) The method of EC47, wherein at least some of the sampled values of the voltage drift reference timestamp respectively comprise a respective generation number and a respective threshold portion, wherein the generation number is according to a master generation number, and the threshold portion is according to the current voltage threshold of the reference location as of the associated periodically sampling.

EC52) The method of EC51, further comprising: subsequent to the current voltage threshold of the reference location exceeding a bound, updating the reference location, and incrementing the master generation number.

EC53) The method of EC44, wherein the recorded sampled value of the voltage drift reference timestamp is of a time of the programming and the sampled value of the voltage drift reverence timestamp associated with the reading is of a time of the reading.

EC54) The method of EC45, wherein at least some of the voltage drift reference timestamps respectively comprise a determined set of one or more optimal read threshold voltages of a voltage drift reference comprising the reference locations.

EC55) The method of EC54, wherein the non-volatile memory comprises SLC memory and the determined set comprises a single optimal read threshold voltage of the one or more optimal read threshold voltages.

EC56) The method of EC54, wherein the non-volatile memory comprises MLC memory and the determined set comprises a plurality of optimal read threshold voltages of the one or more optimal read threshold voltages.

EC57) The method of EC54, further comprising: associating at least some of the voltage drift reference timestamps with respective representations of time.

EC58) The method of EC57, wherein the respective representations of time are according to an offset counter to a system event.

EC59) The method of EC57, wherein the respective representation of time are according to a value derived from an actual time-clock.

EC60) An apparatus comprising:
means for recording a sampled value of a voltage drift reference timestamp associated with programming a particular one of a plurality of groups of pages of a non-volatile memory; and
means for determining a voltage threshold, of a reading of at least some of the particular group of pages programmed, based at least in part on the recorded sampled value of the voltage drill reference timestamp and a sampled value of the voltage drift reference timestamp associated with the reading.

EC61) The apparatus of EC60, wherein the sampled values of the voltage drift reference timestamp are according to a voltage threshold of a reference location of the non-volatile memory.

EC62) The apparatus of EC60, further comprising: means for, subsequent to the recorded sampled value of the voltage drift reference timestamp differing by less than a specified difference with respect to the sampled value of the voltage drift reference timestamp as of the time of the reading, using a default voltage threshold as the voltage threshold of the reading.

EC63) The apparatus of EC60, further comprising:
means for periodically sampling a reference location of the non-volatile memory to determine a current voltage threshold of the reference location; and
wherein the periodically sampling determines, at least in part, the sampled values of the voltage drift reference timestamp.

EC64) The apparatus of EC63, wherein the reference location is a page of the non-volatile memory.

EC65) The apparatus of EC63, wherein the reference location is one of the pages of the particular group of pages.

EC66) The apparatus of EC63, wherein the reference location is in a same block of the non-volatile memory as at least one of the pages of the particular group of pages.

EC67) The apparatus of EC63, wherein at least some of the sampled values of the voltage drift reference timestamp respectively comprise a respective generation number and a respective threshold portion, wherein the generation number is according to a master generation number, and the threshold portion is according to the current voltage threshold of the reference location as of the associated periodically sampling.

EC68) The apparatus of EC67, further comprising: means for, subsequent to the current voltage threshold of the reference location exceeding a bound, updating the reference location, and incrementing the master generation number.

EC69) A non-transitory tangible computer readable medium having a set of instructions stored therein that when executed by a processing element cause the processing element to perform operations comprising:
recording a sampled value of a voltage drift reference timestamp associated with programming a particular one of a plurality of groups of pages of a non-volatile memory; and
determining a voltage threshold, of a reading of at least some of the particular group of pages programmed, based at least in part on the recorded sampled value of the voltage drift reference timestamp and a sampled value of the voltage drift reference timestamp associated with the reading.

EC70) The computer readable medium of EC69, wherein the sampled values of the voltage drift reference timestamp are according to a voltage threshold of a reference location of the non-volatile memory.

EC71) The computer readable medium of EC69, the operations further comprising: subsequent to the recorded sampled value of the voltage drift reference timestamp differing by less than a specified difference with respect to the sampled value of the voltage drift reference timestamp as of the time of the reading, using a default voltage threshold as the voltage threshold of the reading.

EC72) The computer readable medium of EC69, the operations further comprising:
  periodically sampling a reference location of the non-volatile memory to determine a current voltage threshold of the reference location; and
  wherein the periodically sampling determines, at least at part, the sampled values of the voltage drift reference timestamp.

EC73) The computer readable medium of EC72, wherein the reference location is a page of the non-volatile memory.

EC74) The computer readable medium of EC72, wherein the reference location is one of the pages of the particular group of pages.

EC75) The computer readable medium of EC72, wherein the reference location in a same block of the non-volatile memory as at least one of the pages of the particular group of pages.

EC76) The computer readable medium of EC72, wherein at least some of the sampled values of the voltage drift reference timestamp respectively comprise a respective generation number and a respective threshold portion, wherein the generation number is according to a master generation number, and the threshold portion is according to the current voltage threshold of the reference location as of the associated periodically sampling.

EC77) The computer readable medium of EC76, the operations further comprising: subsequent to the current voltage threshold of the reference location exceeding a bound, updating the reference location, and incrementing the master generation number.

System

In some embodiments, an I/O device, such as an SSD, includes an SSD controller. The SSD controller acts as a bridge between the host interface and NVM of the SSD, and executes commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses to the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

In some embodiments, accessing compressed data of varying-sized quanta in NVM provides improved storage efficiency in some usage scenarios. For example, an SSD controller receives (uncompressed) data from a computing host (e.g. relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variants thereof).

In various embodiments, an SSD controller includes a host interface for interfacing with a computing host, an interface for interfacing with NVM such a flash memory, and circuitry for controlling the interfaces and performing (and/or controlling) various aspects of the performing) compressing and uncompressing, as well as lower-level error correction, higher-level error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface Standard, and a PCIe interface standard. According to various embodiments, the computing host is all or any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as an SAS/SATA bridge) operates as a computing host and/or as a bridge to a computing host.

In various embodiments, the SSD controller includes one or more processors. The processors execute firmware to control and/or perform operations of the SSD controller. The SSD controller communicates with the computing host to send and receive commands and/or status as well as data. The computing host executes one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example, a PCIe SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

FIG. 1A illustrates selected details of SSD 101 including SSD Controller 100 that implements optimization of read thresholds (e.g. via zero/one balance management and/or retention drift tracking techniques) for managing Non-Volatile Memory (NVM) elements (e.g., flash memories). SSD Controller 100 is communicatively coupled via one or more External interfaces 110 to a host (such as host 102 of FIG. 1B). According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more of Flash Device 192. According to various embodiments, Device Interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash Device 192 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, Device Interfaces 190 are organized as: one or more busses with one or more of Flash Device 192 per bus; one or more groups busses with one or more of Flash Device 192 per bus, where busses in a group are generally accessed in parallel; or any other organization of one or more of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161. Device Interface Logic 191, and CPU 171. The specific modules and interconnections illustrated in FIG. 1A are merely representative of one embodiment, and many arrangements and interconnections or some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the commands include a read command specifying an address (such as an LBA) and an amount of data (such as a number of LBA quanta, e.g., sectors) to read; in response the SSD provides read status and/or read data. For another example, the commands include a write command specifying an address (such as an LBA) and an amount of data (such as a number of LBA quanta, e.g., sectors) to write; in response the SSD provides write status and/or requests write data and optionally subsequently provides write status. For yet another example, the commands include a de-allocation command (e.g. a trim command) specifying one or more addresses (such as one or more LBAs) that no longer need be allocated; in response the SSD modifies the Map accordingly and optionally provides de-allocation status. In some contexts an ATA compatible TRIM command is an exemplary de-allocation command. For yet another example, the commands include a super capacitor test command or a data hardening success query; in response, the SSD provides appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 and External Interfaces 110; and Data Processing 121 optionally and/or selectively processes data stored in Buffer 131. In some embodiments, Data Processing 121 uses one or more Engines 123 to perform one or more of: formatting; transcoding; and any other data processing and/or manipulation task.

Buffer 131 stores data sent to/from External Interfaces 110 from/to Device Interfaces 190. In some embodiments, Buffer 131 additionally stores system data, such as some or all map tables, used by SSD Controller 100 to manage one or more of Flash Device 192. In various embodiments, Buffer 131 has one or more of: Memory 137 used for temporary storage of data; DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability, where redundancy is at a flash device (e.g., multiple ones of Flash Device 192) level and/or a flash die (e.g., Flash Die 194) level instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 161 is used to provide lower-level error correction and/or redundancy functions, such as in accordance with one or more ECC techniques. In some embodiments, ECC 161 implements one or more of: a CRC code; a Hamming code; an RS code: a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash Device 192 according to a protocol of Flash Device 192. Device Interface Logic 191 includes Scheduling 193 to selectively sequence control of the instances of Flash Device 192 via Device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Die 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocation, the Map points to a default value to return if the LBAs are read. For example, when processing a de-allocation command, the Map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as to a second range) as another default value. The default values, in various embodiments, are defined by flash memory, hardware, firmware, command and/or primitive arguments and/or parameters, programmable registers, or various combinations thereof.

In some embodiments, Map 141 uses Table 143 to perform and/or to look up translations between addresses used on External Interfaces 110 and data addressing used on Device Interfaces 190. According to various embodiments, Table 143 is one or more of: a one-level map; a two-level map; a multi-level map: a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writable. Recycler 151 is enabled to determine which portions of the instances of Flash Device 192 are actively in use (e.g., allocated instead of de-allocated), such as by scanning a map maintained by Map 141, and to make unused (e.g., de-allocated) portions of the instances of Flash Device 192 available for writing by erasing them. In further embodiments, Recycler 151 is enabled to move data stored within instances of Flash Device 192 to make larger contiguous portions of the instances of Flash Device 192 available for writing.

In some embodiments, instances of Flash Device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD Controller 100. CPU 171 includes CPU Core 172. CPU Core 172 is, according to various embodiments, one or more single-core or multi-core processors. The individual processors cores in CPU Core 172 are, in some embodiments, multi-threaded. CPU Core 172 includes instruction and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash Device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identity Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include one or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
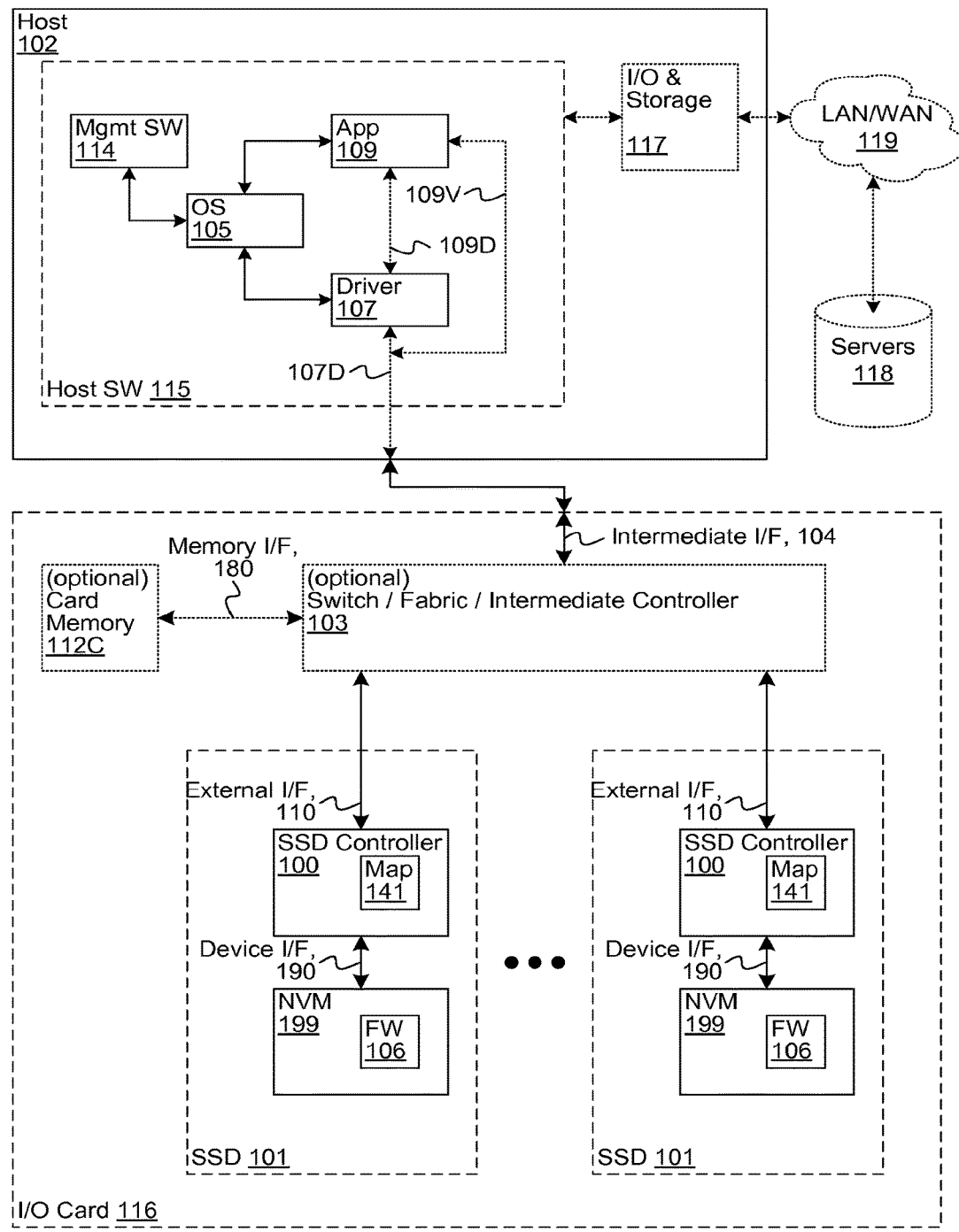
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various bases embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 101 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to Host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variations thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software ←→I/O Device Communication, e.g., data sent/received to/from one or more of the instances of SSD 101 and front/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linux (e.g. Red Hat, Debian, and Ubuntu), and various versions of MacOs (e.g. 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of Application ←→I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application ←→I/O Device Communication (e.g. bypass via a VF for an application), e.g. a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 100. A firmware image has, for another example, one or more images of constants, parameter values, and NVM device information, referenced, e.g., by the CPU core during the firmware execution. The images of firmware correspond, e.g., to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the Host directly via External Interfaces 110. In various embodiments, SSD Controller 100 is coupled to the Host via one or more intermediate levels of other controllers, such as a RAID controller. In some embodiments, SSD 101 (or variations thereof) corresponds to a SAS drive or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments where Host 102 is a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage Devices/ Resources 117 and optional LAN/WAN 119) with one or more local and/or remote servers (e.g. optional Servers 118). The communication enables, for example, local and/or remote access, management, and/or usage of any one or more of SSD 101 elements. In some embodiments, the communication is wholly or partially via in Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a Memory Stick storage component, and an xD-picture card storage component.

In various embodiments, all or any portions of an SSD controller (or a computing-host flash memory controller), or functions thereof, are implemented in a host that the controller is to be coupled with (e.g., Host 102 of FIG. 1B). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to Recycler 151 of FIG. 1A) is implemented partially via software on a host and partially via hardware in a computing-host flash memory controller.

In various embodiments and/or usage scenarios, one or more management functions are performed for NVM devices (e.g. one or more flash die and/or flash chips) in accordance with logical slices and/or sections. The management functions include any one or more of reading, recycling, erasing, programming/writing, and other management functions. The logical slices and/or sections are sometimes referred to as R-blocks.

An R-block is exemplified as a logical slice or section across various die (e.g. all die, all die excluding ones that are wholly or partially failed, and/or one or more selected subsets of die) of, e.g., a flash memory. For example, in a flash memory having R flash die, each flush die having N blocks, each R-block is the $i^{th}$ block from each of the flash die taken together, for a total of N R-blocks. Continuing with the example, if one of the R flash die fails, then each R-block is the $i^{th}$ block from each of the flash die except the failed flash die, for a total of N-1 R-block. For another example, in a flash memory having R flash die, each with N blocks, each R-block is the $i^{th}$ and $(i+1)^{th}$ block from each of the flash die, for a total of N/2 R-blocks. For yet another example, in a flash memory having a plurality of dual plane devices, each R-block is the $i^{th}$ even block and the $i^{th}$ odd block from each of the dual plane devices. For a final example, in a flash memory having R flash die, each with N blocks, each R-block is the $i^{th}$ through $(i+k-1)^{th}$ block from each of the flash die, for a total of N/k R-blocks.

In various embodiments with blocks treated in pairs or other associated groups as part of forming an R-block, respective pages from each block of an associated group of the blocks are also treated as a unit, at least for writing, forming a larger multi-block page. For example, continuing the foregoing dual plane example, a first page of a particular one of the even blocks and a first page of an associated one of the odd blocks are treated as a unit for writing, and optionally and/or selectively as a unit for reading. Similarly, a second page of the particular even block and a second page of the associated odd block are treated as a unit. According to various embodiments, a page of NVM as used herein refers to one or more of: a single page of NVM; a multi-block page of NVM; a multi-block page of NVM for writing that is optionally and/or selectively treated as one or more individual pages for reading; and any other grouping or association of pages of NVM.

Other arrangements of flash die blocks for management as R-blocks are contemplated, including mapping between virtual and physical block addresses to ensure that R-blocks have one block from each die, even if some blocks are inoperable. In various embodiments, some of the N blocks in each flash die are used as spares so that the mapping between virtual and physical block addresses has spare (otherwise unused) blocks to replace defective ones of the blocks in the R-blocks.

Zero/One Balance Restoration

Figure 2A:
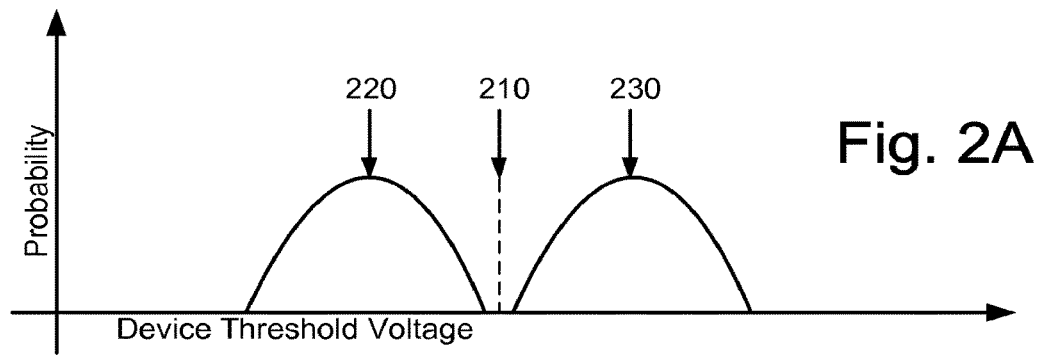
FIGS. 2A through 2D illustrate example device threshold voltage distributions relevant to zero/one balance restoration.
Figure 2B:
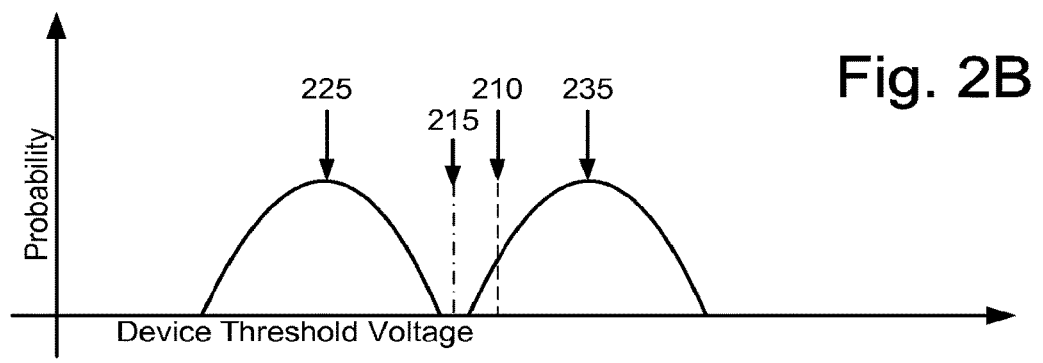
Figure 2C:
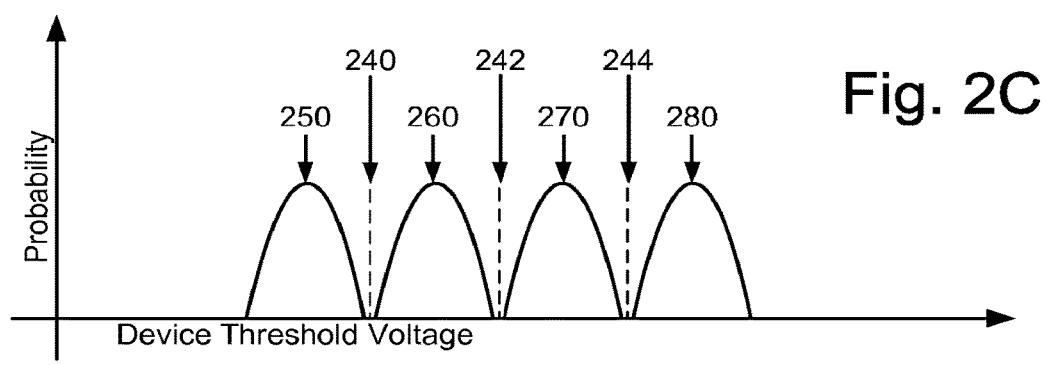
Figure 2D:
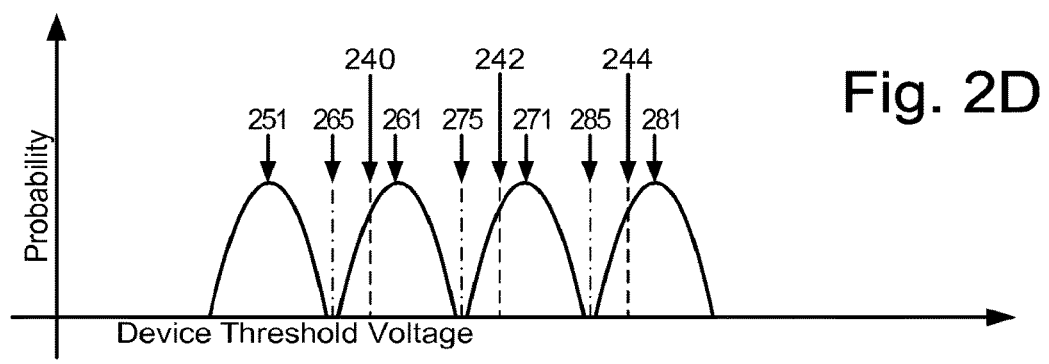

FIGS. 2A through 2D illustrate device threshold voltage distributions relevant to "zero/one" balance restoration. For the purposes of this discussion, each hill-like bump is an abstraction for an independent Gaussian-like curve representing a device threshold voltage probability distribution for a respective state of a read unit sized portion of an NVM. The device threshold voltage axis is drawn with increasing positive voltage to the right. An absolute scale is purposefully not provided, and no reference points are identified, such that the plots apply more generally to a larger population of NVMs. FIGS. 2A and 2B are SLC specific, while FIGS. 2C and 2D are MLC specific.

In FIG. 2A, representing an initial time (e.g., when the corresponding data is written), leftmost distribution 220 represents a logical one and the rightmost distribution 230 represents a logical zero. Depending on the technology, the leftmost distribution may reside (at least predominantly) at negative voltages. Read threshold 210 is ideally situated between the two distributions.

Except as linked by the embodiments herein, independent of these device threshold voltage distributions, in some embodiments, the NVM is written with specific knowledge of the statistical distribution of zeroes and ones being stored. More particularly, in some embodiments various encryption and/or scrambling techniques are used such that the statistical distribution of zeroes and ones is 50-50 percent (50 percent zeroes and 50 percent ones). When the SLC is read using the nominal read threshold, which is ideally situated for the case of FIG. 2A, the observed read data statistical distribution of zeroes and ones is likewise 50-50 percent. The statistical distribution being 50-50 percent does not mean that any one sample of data would have an exactly even balance of zero bits and one bits, but rather that an average over many samples produces a ratio of zero bits and one bits that converges on 50-50 percent with an increasingly tight probabilistic bound as a number of the samples increases. An analogy is a distribution of heads and tails when a coin is flipped many times, generating a Gaussian distribution with a variance that is approximated by n/4 where n is a number of the coin flips. For example, if there are 18,432 bits in a read unit with a 50-50 percent statistical distribution of zero bits and one bits, the variance in the number of zero bits (or one bits) is approximately 4,608 and the standard deviation is approximately 68. With a standard deviation of 68, less than one in one million samples of read units would be expected to have a number of zero bits more than 340 (5 standard deviations) away from the average of 9,216.

In FIG. 2B, representing a later time, nominal read threshold 210 is as in FIG. 2A, and the two device threshold voltage distributions 225 and 235 are shifted with respect to their earlier respective distributions 220 and 230 in FIG. 2A. For the purposes of example the two distributions are shown as having both uniformly shifted to the left (toward more negative voltages). It should be understood that more generally the two distributions are enabled to move independently of each other and in either a positive or negative direction.

In view of FIG. 2B, when the SLC is again read using the nominal read threshold 210, it is predictable that the observed statistical distribution of zeroes and ones read directly from the NVM (e.g., prior to any error correction) will not 50-50 percent. More particularly, for the conceptual example given, an erroneous excess of ones is to be expected, as the read threshold is such that some of the zeroes will be falsely read as ones.

In practice, the direction of inference is reversed. That is, in practice, generally such shifts in the device threshold voltage distributions are not known or directly knowable. In some embodiments, instead the observation of a disparity in the zeroes and ones read from the NVM (with respect to the known stored distribution of zeroes and ones) is used to infer the existence of shifts in the device threshold voltage distributions. Furthermore, in these embodiments, the read threshold is adjusted based at least as part on the disparity observed (as detailed elsewhere herein) to read threshold 215, as required until the zero/one balance is restored.

Similarly, FIG. 2C represents an initial time (such as when the corresponding data is written) with initial device threshold voltage distributions, while FIG. 2D represents a later time with corresponding later device threshold voltage distributions. More specifically, for a selected Gray code mapping, respectively representing the 11, 10, 00, and 10 states, device threshold voltage distributions 251, 261, 271, and 281 (of FIG. 2D) are shifted with respect to their earlier respective device threshold voltage distributions 250, 260, 270, and 280 (of FIG. 2C). Three nominal (initial) read thresholds are also shown: $V_{READ1}$ 240, $V_{READ2}$ 242, and $V_{READ3}$ 244. Again for the purposes of example, in FIG. 2D the four distributions are shown as having all uniformly shifted to the left (toward more negative voltages). It should be understood that more generally the four distributions are enabled to move independently of each other and in either a positive or negative direction.

In some embodiments, various scrambling techniques are used such that the statistical distribution of the four states is 25-25-25-25 percent (25 percent in each state). When the MLC is read using the nominal read thresholds that are ideally situated lot the case of FIG. 2C, in some embodiments the statistical distribution of the four states is configurable to likewise be 25-25-25-25 percent. (As discussed elsewhere, zeroes and ones are directly observable by the controller, but all four states are inferable as required.) In some embodiments, the observations of a disparity (a deviation from the expected 25-25-25-25 percent) read from the NVM (with respect to the known stored distribution of states) is used to infer the existence of shifts in the device threshold voltage distributions. The read thresholds are then adjusted (as detailed elsewhere herein) as shown in FIG. 2D to become $V_{READ1}$ 265, $V_{READ2}$ 275, and $V_{READ3}$ 285. In some embodiments, the read threshold adjustments are performed separately for lower page reads (adjusting $V_{READ2}$ 275) and upper page reads (adjusting $V_{READ1}$ 265 and/or $V_{READ3}$ 285).

Functions for Zero/One Balance Restoration

Figure 3:
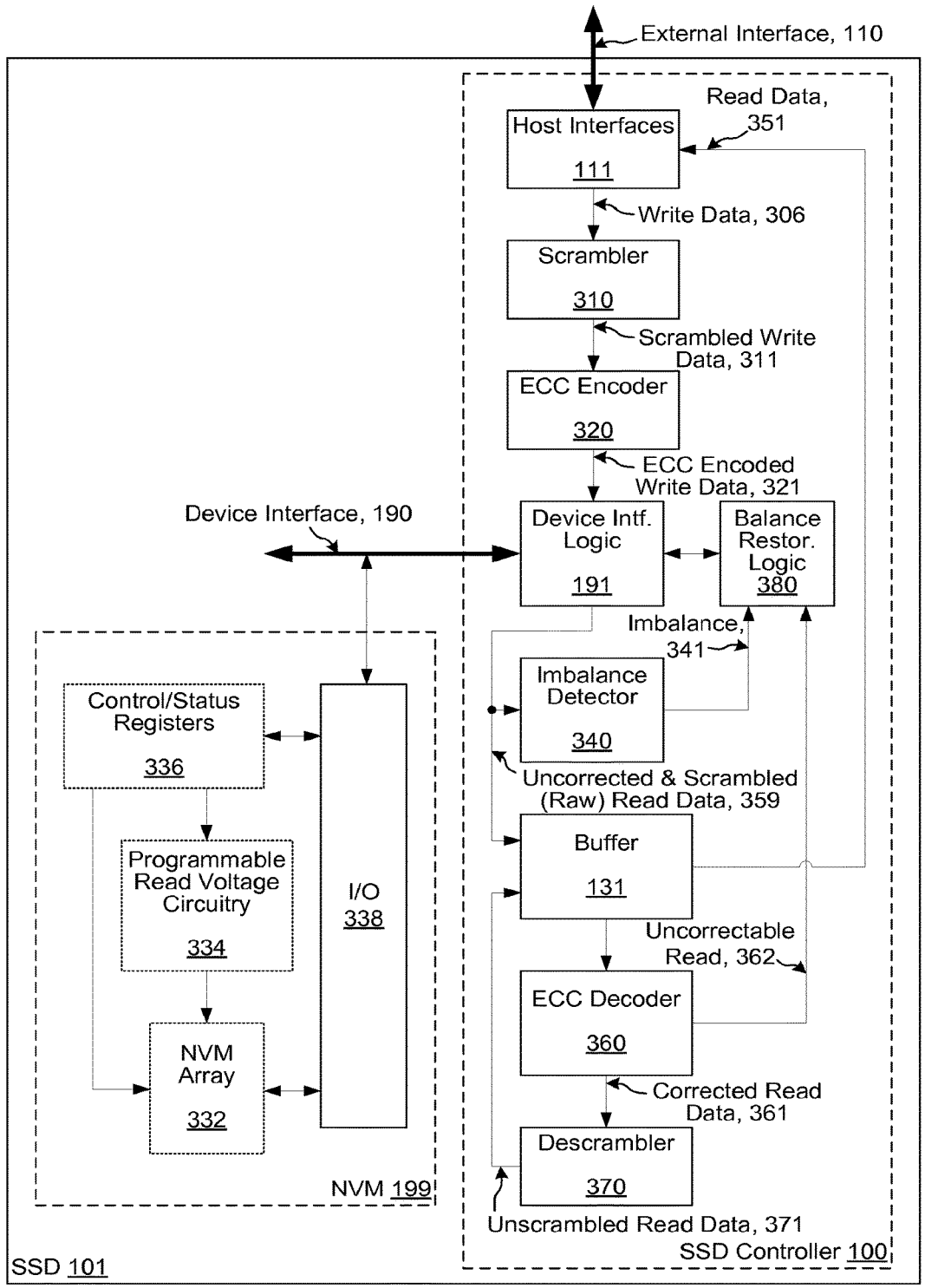
FIG. 3 illustrates selected details of a system embodiment of an instance of the SSD of FIG. 1A, providing particular details regarding zero/one balance management and retention drift tracking.

FIG. 3 provides alternate views of SSD 101, SSD Controller 100, and NVM 199 of FIGS. 1A and 1B, redrawing selected logic block boundaries to emphasize particular functions. SSD 101 at the top level features External Interface 110, SSD Controller 100, NVM 199, and Device Interface 190.

External Interface 110 is coupled to a host, such as Host 102 of FIG. 1B, and supports a high-level storage protocol such as SATA, including host-sourced storage-related commands and write-data and controller-sourced read-data, and as detailed in the above discussion of FIG. 1A. Device Interface 190 supports low-level NVM I/O transactions, as detailed in the discussion of FIG. 1A. NVM 199 features NVM Array 332, Programmable Read Voltage Circuitry 334, Control/Status Registers 336, and I/O 338. SSD Controller 100 features Host Interfaces 111, Scrambler 310, ECC Encoder 320, Device Interface Logic 191, Imbalance Detector 340, Buffer 131, ECC Decoder 360, Descrambler 370, and Balance Restoration Logic 380. Host Interfaces 111 couples with the Host via External Interface 110 as discussed previously, provides Write Data 306 to Scrambler 310, and receives Read Data 351 from Buffer 131.

The write path and functionality are as follows. Scrambler 310 operates on Write Data 306 to generate Scrambled Write Data 311 to ECC Encoder 320. Scrambler 310 scrambles Write Data 306 in a reversible manner and such that the Scrambled Write Data 311 has a known statistical distribution of states stored. An example of a block including scrambled data is a block containing Scrambled Write Data 311. E.g. an SLC block including scrambled data contains an equal number of '0' and '1' values and a 4LC block including scrambled data contains an equal number of '00', '01', '10', and '11' states. In some embodiments, Scrambler 310 performs encryption, such as via an AES encoder that randomizes the data as a by-product of encryption. In some embodiments, Scrambler 310 uses a Linear Feedback Shift Register (LFSR) to randomize the data (but without any data security intent). ECC Encoder 320 processes the Scrambled Write Data 311 to add additional ECC bits, resulting in ECC Encoded Write Data 321 that is provided to Device Interface 191 for storing into NVM 199 via Device Interface 190.

The basic read path and functionality are as follows. NVM pages, including Uncorrected and Scrambled (Raw) Read Data 359, are received from NVM 199 via Device Interface 190. Continuing with respect to FIG. 3, each read unit nominally includes the data scrambled by Scrambler 301 as well as the additional ECC bits generated by ECC Encoder 320, but as generally unintentionally altered as a result of NVM storage and retrieval operations. The read units are provided to ECC Decoder 360 via Buffer 131. ECC Decoder 360 processes the read units, exploiting the included additional ECC bits to generally correct any errors that may have arisen at any point and time since the data was first ECC encoded, resulting in Corrected Read Data 361, which is provided to Descrambler 370. The Descrambler 370 operates on the Corrected Read Data 361, reversing the scrambling performed by Scrambler 310, resulting in Unscrambled Read Data 371 that is provided as Read Data 351 to Host Interfaces 111 via Buffer 131.

The read path and functionality further includes Imbalance Detector 340 and Balance Restoration Logic 360. Imbalance Detector 340 monitors Raw Read Data 359 received from the NVM, and at least temporarily maintains data on the statistical distributions of state. Balance Restoration Logic 380 interacts with NVM Control/Status Registers 336, via Device Interface Logic 191 and NVM I/O 338, to selectively adjust NVM read thresholds (used to read the NVM Array 332) via NVM Programmable Read Voltage Circuitry 334. An example of NVM read thresholds are current read thresholds referred to in FIGS. 5A and 5B. In some embodiments, NVM read thresholds are written to Control/Status Register 336 and configure Programmable Read Voltage Circuitry 334. The read thresholds are adjusted based upon a) Uncorrectable Read 362 detected by ECC Decoder 360, and b) Imbalance 341 (in the statistical of state) detected by Imbalance Detector 340. The read unit is binary data in both SLC and MLC embodiments. Disparities in the zeroes and ones are directly measurable in the SLC case (or when an MLC is operated as though it were an SLC). In some embodiments, disparities in the more than two states of an MLC are inferred based on knowledge of how the data was stored in the NVM.

FIG. 3 illustrates functions for zero/one balance restoration in a context where a host operates as a source and a sink for data written to and read from NVM 199. In various embodiments (such as illustrated by FIG. 1A and FIG. 1B), one or more other agents operate as sources and sinks for data written to and read from NVM 199. An example of the other agents is Recycler 151 of FIG. 1A, that moves data from one location to another in NVM 199, as described elsewhere herein.

In various embodiments, any or all portions of functionality associated with any one or more of Scrambler 310, ECC Encoder 320, ECC Decoder 360, and Descrambler 370 are implemented at least in part using one or more of Data Processing 121 and ECC 161 (both of FIG. 1A).

Control Flows for Zero/One Balance Restoration

Figure 4:
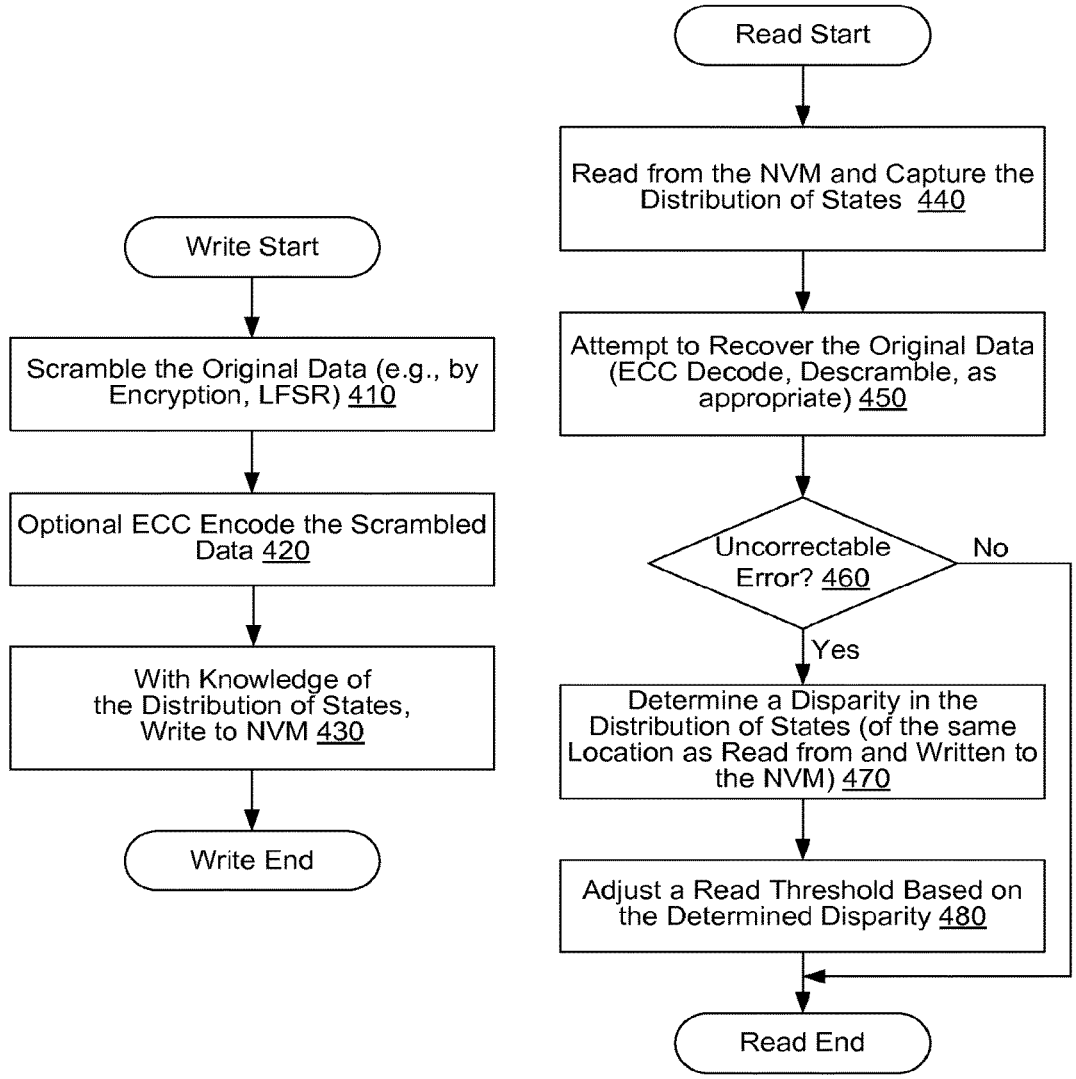
FIG. 4 illustrates selected control flow details for an embodiment of the SSD of FIGS. 1A, 1B, and 3, providing particular details regarding write related operations (actions 410 through 430) and read related operations (actions 440 through 480).

FIG. 4 illustrates selected control flow details for an embodiment of the SSD of FIGS. 1A, 1B, and 3, providing particular details regarding write related operations and read related operations. Write operations start with operations 410 and continue through 430. While a return path is not explicitly drawn, subsequent write operations start anew with action 410. Similarly, read operations start with action 440, continue through 460, and conditionally continue through 480. While a return path is not explicitly drawn, subsequent read operations start anew with action 440. It is assumed that at least an initial write precedes a read the same location. Otherwise, except for contrived cases, such as in testing, the read operations and write operations are generally invoked independently as application needs dictate, for the same or generally different locations. Nevertheless, in a heuristic example, the first read operation 440 conceptually continues immediately after the last write operation 430 for a same location.

Considering in more detail the write related operations, original data to be written to the NVM is generally first scrambled in action 410, such as via encryption or use of an LFSR. Except where more specificity is employed the term "scrambling" as used herein refers to the manipulation of the original data to be written via any manipulation or selection that results in a known statistical distribution among the various states stored in the NVM. Scrambling methods include encryption and LFSR techniques. (See also Scrambler 310 of FIG. 3.) In some encryption embodiments, the scrambling is in accordance with at least one version of the AES encryptions specification. In some LFSR embodiments, the scrambling is in accordance with at least one choice of LFSR. In some embodiments, the scrambling is more directly determined via the selection of one or more test patterns, providing a chosen statistical distribution of states when written to the NVM (without necessarily using encryption or LFSR processing).

The LFSR is a hardware shift register having a combinational logical feedback network generating an input bit from a linear function of selected taps of the shift register, or a software model thereof. The LFSR generates a deterministic pseudorandom sequence. At least conceptually, the LFSR-generated pseudorandom sequence is modulo 2 added to the original data to provide the scrambled data.

Subsequently, the scrambled data is next optionally ECC encoded, as illustrated in action 420. (See also ECC Encoder 320 of FIG. 3.) ECC encoding provides redundant information that facilitates data recovery (via error correction) in the face of errors that arise for a variety of reasons when using NVM. Such errors are more prevalent, and thus ECC encoding more advisable, with one or more of smaller geometries, greater use, greater age, greater temperature excursions, and use of MLC memories.

The scrambled and optionally ECC encoded data is then written to the NVM, as shown in action 430, the last of the write related operations. The distribution of states being written is known as a result or the scrambling. In the case of the use of SLC memories and AES encryption, the zero-one distribution is known to be 50-50 (i.e., 50 percent zeroes and 50 percent ones). In the case of the use of a 4LC (4-level MLC) memories and AES encryption, the distribution after writing both lower and upper pages is known to be 25-25-25-25 (i.e., 25 percent to each of the four states).

In some embodiments, at least one reference region is dedicated for the use of one or more test patterns as discussed above. In some embodiments, the location of the reference region is selected to minimize (or conversely, to maximize) the impact on the rest patterns of various NVM write/read artifacts. In some embodiments, the reference region is a reference page, and its location is chosen to be a last page written in a block, so as to minimize the impact of write disturbs on the data written. As some of the phenomena affecting the voltage distributions are time and/or temperature variant, the reference region serves as a known measure of these effects on zero/one disparity.

Considering in more detail the read related operations, starting in action 440, one or more read units are read from the NVM and the distribution of states is captured. In some embodiments, each of a zeroes count and a ones count are directly determined. Next, in action 450, an attempt is made to recover the original data. This performs the inverse of whatever data manipulation operations were performed prior to writing. ECC encoding was optionally added prior to writing, and thus the read units next optionally undergo ECC decoding. (See also ECC Decoder 360 of FIG. 3.) On a per read unit basis, if ECC decoding is successful, then descrambling is performed next, as appropriate. E.g., where AES encryption was used prior to writing, AES-decryption is performed. Or, where an LFSR-generated pseudorandom sequence was used, the same sequence is modulo 2 added to the ECC decoded data from the read unit.

The read related operations conclude early when the original data is recoverable, either without error or for errors that are correctable via ECC decoding. See the "no" path from decision 460. However, on uncorrectable errors of any of the read units, actions 470 and 480 are also performed. See the "yes" path from decision 460. In action 470, a disparity in the distribution of states is evaluated. (See also Imbalance Detector 340 of FIG. 3.) In some embodiments, the determined disparity is a determined difference between the zeroes count and the ones count. In various embodiments, the determined disparity is computed over all of the read units, even if less than all of the read units had uncorrectable (e.g. hard-decision decode) errors.

Next, in action 480 an adjusted value (a.k.a. a threshold shift) for at least one read threshold is determined at least in part based on the magnitude of the determined disparity In some embodiments, if the magnitude of the determined disparity is below a predetermined tolerance, the read threshold is not adjusted. In some embodiments, a multi-factor "correction algorithm" is employed for determining the adjusted read threshold, for which the magnitude of the determined disparity is but one factor.

In some embodiments, the correction algorithm takes the form of a lookup table used to select a replacement value for the read threshold. The magnitude of the determined disparity is the basis for at least part of the index in the lookup table. In some embodiments, the lookup table is pre-characterized (weighted) based on the particular vendor of the NVM being used. In some embodiments, the index has additional components, including one or more of; program/erase cycles, age, retention time (time since the last write), temperature, and any other factors that may pertain to drift of, or disturbances to, the device threshold voltages distributions of the NVM. (See also Balance Restoration Logic 380 of FIG. 3.)

Here and throughout the detailed description, it should be remembered that in commonly used flash memory micro-architectures, granularity of operations is different; e.g. a read unit is a minimum size for reading, a page is a minimum size for writing (e.g. programming), and a block is a minimum size for erasing. Each block includes a corresponding plurality of pages, and each page includes a corresponding plurality of read units. Its various embodiments, an SSD controller reads from and/or writes to one or more flash memories in quanta corresponding to any one or more of: one or more read units, one or more pages, and one or more blocks.

In some embodiments, disparities are evaluated on an entire page basis. In some embodiments, disparities are evaluated on a read unit basis. The disparity evaluation performed in conjunction with an uncorrectable (e.g. hard-decision decode) error on a read is performed with respect to the same (page or read unit) location as written in the most recent write that included that same location.

Prediction of Optimal Read Thresholds Via Monitoring of Retention Drift History Embodiments represented by FIG. 4 adjust at least one read threshold in response to an uncorrectable (e.g. hard-decision decode) error. Embodiments represented by FIGS. 5A, 5B, 5C, and 6 adjust at least one read threshold in response to any one or more of manufacturing characterization, initial use, a timer (e.g. periodic, irregular, or random), a bit error rate that is above a threshold, and an uncorrectable (e.g. hard-decision decode) error. Various embodiments represented by FIGS. 5A, 5B, 5C, and 6 are operated in contexts where blocks of NVM are managed in groups, and adjustment of at least one read threshold for all of the blocks of a particular group is based on partial reads of a sampling of the blocks of the particular group. For example, if at least some of the partial reads meet a condition, then the read threshold is adjusted or all of the blocks of the particular managed group. In various embodiments, the adjusting is via a retention drift clock (retention drift tracking) technique. In some embodiments, techniques represented by FIG. 4 are used in conjunction with techniques represented by FIGS. 5A, 5B, 5C, and 6.

Figure 5A:
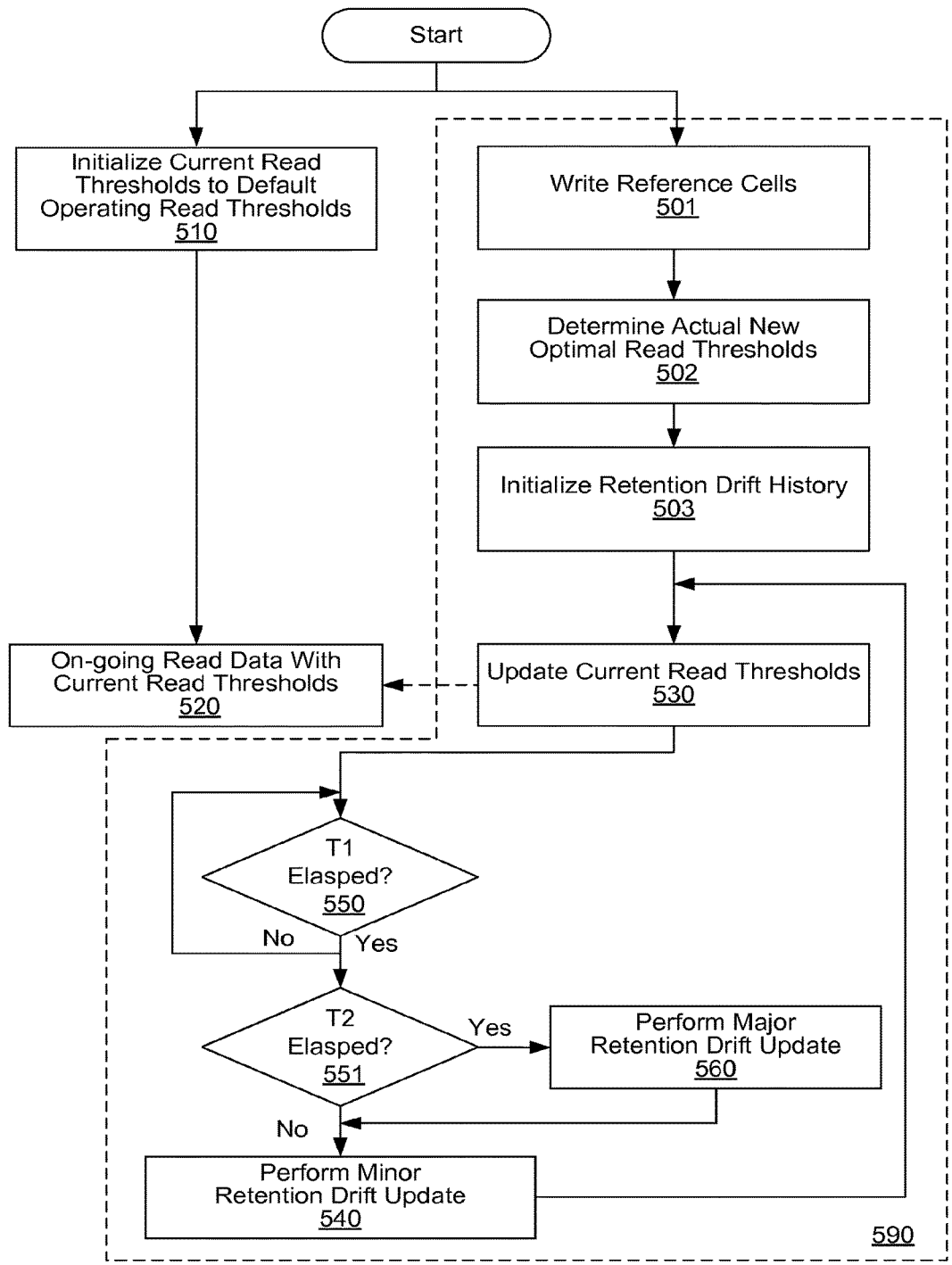
FIG. 5A illustrates a flow diagram of selected details of an embodiment of determining optimized read thresholds for an NVM (e.g. of an SSD) via retention drift tracking.

FIG. 5A illustrates a flow diagram of selected details of an embodiment of optimizing of read thresholds for an NVM (e.g. of an SSD). In various embodiments, the NVM is provided with default operating read thresholds specified by a manufacturer of the NVM and guaranteed by the manufacturer to function correctly. Reading a read unit of the NVM is performed in accordance with current read thresholds. Initially, the current read thresholds are set to the default operating read thresholds, in action 510. In some embodiments, the default operating read thresholds are written to Control/Status Register 336 and configure Programmable Read Voltage Circuitry 334 of FIG. 3.

Reads of the NVM are performed in accordance with the current read thresholds, in action 520. Conceptually in parallel with the reads of action 520, the controller also performs various activities associated with Retention Drift Tracking 590, which collectively have the goal of predicting optimal read threshold voltages, such that hard read errors are relatively infrequent. In some embodiments and/or usage scenarios, Retention Drift Tracking enables reducing or avoiding hard (ECC uncorrectable) read errors. Retention Drift Tracking is initialized via Write Reference Cells 501, Determine Actual New Optimal Read Thresholds 502, and Initialize Retention Drift History 503. The Retention Drift Tracking is then enabled to update the current read thresholds with new operating read thresholds, in action 530, which are optimized to improve one or more of performance, power consumption, and reliability. It should be noted that while at some embodiments action 520 implements data reads before the retention drift history is initialized in action 503, to some embodiments, action 530 is enabled to occur prior to the first read of data in action 520.

The overall functionality of Retention Drift Tracking 590 is also referred to as a "Retention Drift Clock", which acts as a standard or reference for read threshold voltages (Vth) over time and temperature (as well as a measure of retention drift over time and temperature) in a loosely analogous way that a clock generator provides a reference or standard for deriving timing signals. In furtherance of this analogy, each determined set of the one (SLC memory) or more (MLC memory) optimal read threshold voltage(s) of a voltage drift reference is referred to herein as a "timestamp", as is each corresponding entry in the Retention Drift History. In some embodiments, the timestamp entries in the retention drift history will also include a representation of time (such as an offset counter to a system event, or a value derived from an actual time-clock), but more generally in some embodiments the timestamp entries in the retention drift history will not include a representation of time.

The current read thresholds are updated in action 530, at least in part according to an amount of retention drill as determined by the retention drift history, as detailed below. In some embodiments the update of the current read thresholds is performed periodically in time, such as once an hour. In some embodiments for example, the update of the current read thresholds is performed via Minor Retention Drill Update 540, in accordance with one or more of timers T1 550 and T2 551, as described in more detail below. In some embodiments, the update or the current read thresholds is performed periodically in a number of reads, such as once every 100 K reads. The updating comprises evaluating (for example in action 555, described in more detail below, in some embodiments by simple comparing) a new reference timestamp (for example determined in action 566, described in more detail below) of a region (such as an R-block) in view of the retention drift history (a compilation/recordation of reference timestamps, for example as updated by action 567, subsequent to action 566, and described at more detail below). In some embodiments a new region-specific reference timestamp is recorded whenever the corresponding region is programmed. In some embodiments, the current read threshold of the region is adjusted (for example in action 530 and in accordance with action 555) whenever a new reference timestamp of the region is recorded (for any reason).

The reference cells (a.k.a., the voltage drift reference) written in action 501 are a collection of cells chosen according to a predetermined criteria, and according to embodiment include one or more pages, one or more blocks, or one or more other die portions, on one or more of the Flash Die 194 of FIG. 1A. In some embodiments, at least two pages are used for the reference cells, so as to account for inter-cell interference (ICI). In some embodiments, the reference pages are programmed with a pattern having a statistical distribution enabled to match normal use (non-reference cell) data. In some embodiments, the statistical distribution is random. In some embodiments, separate reference pages are maintained for SCL (or lower page) data and MLC (or upper page) data, to account for different drifts expected from lower pages and upper pages. In some embodiments, to account for block-to-block variations within die, and/or die variation, multiple blocks at different locations and/or different dies are used for the reference cells (the reference cells are purposefully so distributed), and averaging is employed to mitigate the variations. According to embodiment, to keep the P/E cycles or wear of the reference cells relatively close to the average P/E cycles or wear of the drive as a whole, the reference cells are "rotated" (alternated with) at least one other corresponding collection of normal use (non-reference) cells in accordance with predetermined criteria, such as after a certain time period, for example 3 months, and/or after a certain number of global P/E cycles, for example 200.

The determination of actual new optimal read thresholds (a.k.a. the sampling of the voltage drift reference timestamp) in action 502 (and also as performed in action 566) is performed in accordance with a predetermined method, such as an empirical evaluation of the zero-one balance/disparity, discussed elsewhere herein. The determined actual optimal read thresholds (a.k.a. the sampled timestamp) may differ from the intended/nominally programmed read threshold values for a variety of reasons, including inter-cell interference during initial programming P/E cycles of the device, read disturbs, and retention drift due to elapsed time and temperature excursions. Once the actual new optimal read thresholds are determined, they are logged as a first entry in a Retention Drift History. (Stated differently, the sampled timestamp of the voltage drift reference is recorded in the Retention Drift History.) The number of red thresholds stored per entry is a function of the number of levels of the non-volatile memory. According to embodiment, for example, there is only one read threshold stored for SLC memory, while there are 3 read thresholds stored for 4LC memory. The Retention Drift History is variously referred to as (being stored in) a (Retention Drift History) Log, Store, Buffer, or Cache. According to embodiment, a portion of Buffer 131 of FIG. 1A, and/or a portion of one or more of the Flash Die 194 of FIG. 1A, are used for storing and/or updating the Retention Drift History. As will be seen, use of the Retention Drift History enables the read thresholds to be automatically compensated for time and temperature, including factors such as time powered off, temperature of storage, etc.

In some embodiments, new operating read thresholds are written to the Control/Status Register 336 and configure Programmable Read Voltage Circuitry 334 of FIG. 3. In various embodiments, subsequent reads are performed in accordance with current rend thresholds that have been updated to the new operating read thresholds update by action 530 of the Retention Drift Tracking. The Retention Drift Tracking is described as operating conceptually in parallel with the reads, in that at least in some embodiments, reads of the NVM in action 520 are performed such that reads or writes of the NVM in action 590 are prevented from being performed simultaneously with the reads of the NVM in action 520. For example, the reads of the NVM in action 520 are performed at a higher priority than the reads or writes of the NVM in action 590. For another example, the reads of the NVM in action 590 are performed in a background manner, such as when the NVM is otherwise idle.

In various embodiments, the SSD periodically re-evaluates the current read thresholds. A first timer (T1), and a second timer (T2), track the time elapsed since the last Minor and Minor Retention Drift Updates were performed, respectively in decision 550 and decision 551. When the T1 timer expires (but not T2), a Minor Retention Drift Update is performed. When the T2 timer expires, Major Retention Drift Update 560 is performed followed by Minor Retention Drift Update 540. In various embodiments, the timers are configurable through any one or more of software, firmware, and hardware. In some embodiments, the first timer (T1) is configured to six to twenty-four hours, while the second timer (T2) is configured to one or more weeks.

In some embodiments, the Minor and Major Retention Drift Updates are combined and only the first timer (T1) is used. More particularly, in such first timer only embodiments, upon a "Yes" result by decision 550, control flows directly into action 560. The first timer (T1) is configured for example to lapse once a day, once a week, or once a month. More generally, according to embodiment, the frequency at which the actual new optimal read thresholds are determined is chosen according to one or more of: a type of NVM and its characteristics; history of the rate of change of read threshold; temperature, such as from a temperature sensor; elapsed time, such as from executing cycles during which the device is operating; once at every power-on; once at every reset; once at every wake-up from sleep; and other factors. In some embodiments, upon a determination that a block has not been read within a predetermined interval of the block having been written, a Minor and/or Major Retention Drift Update is forced prior to the block being read.

Figure 5B:
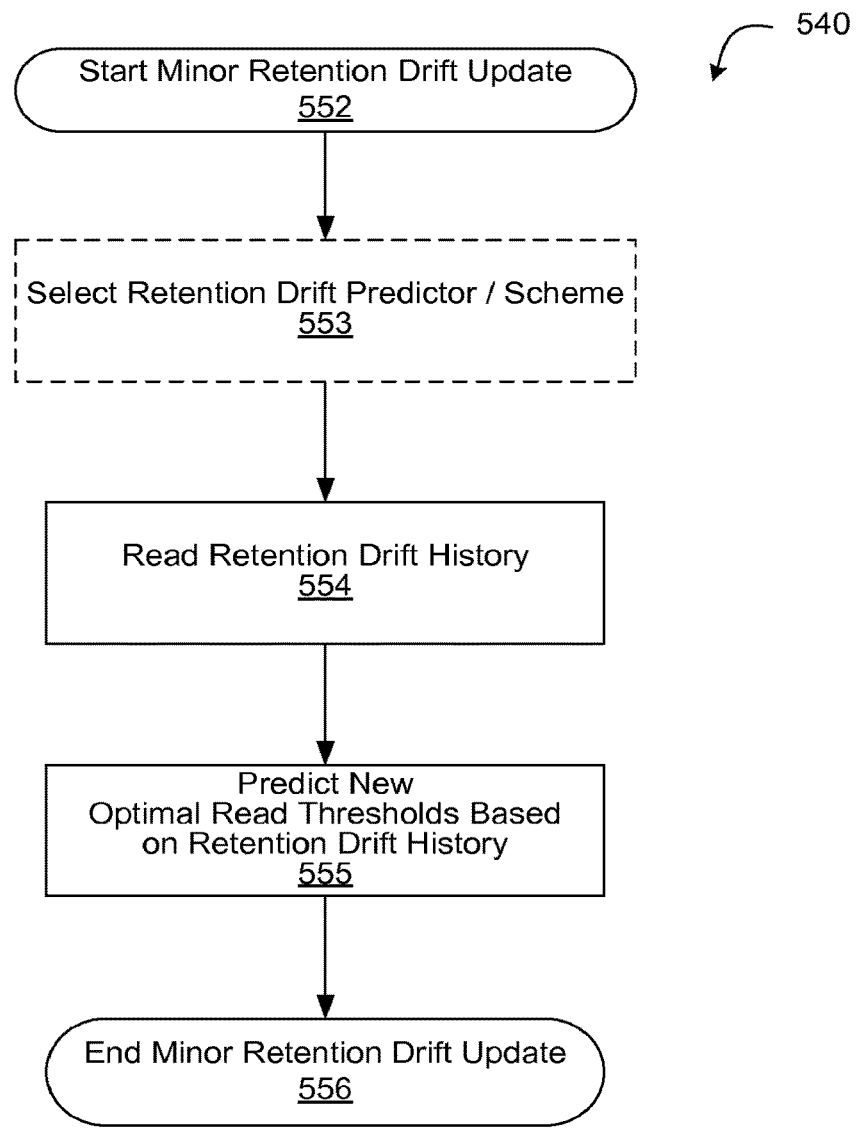
FIGS. 5B and 5C respectively illustrate flow diagrams of selected details of embodiments of a Minor Retention Drift Update 540, and a Major Retention Drift Update 560, of device threshold voltages in a managed group of blocks of an NVM.
Figure 5C:
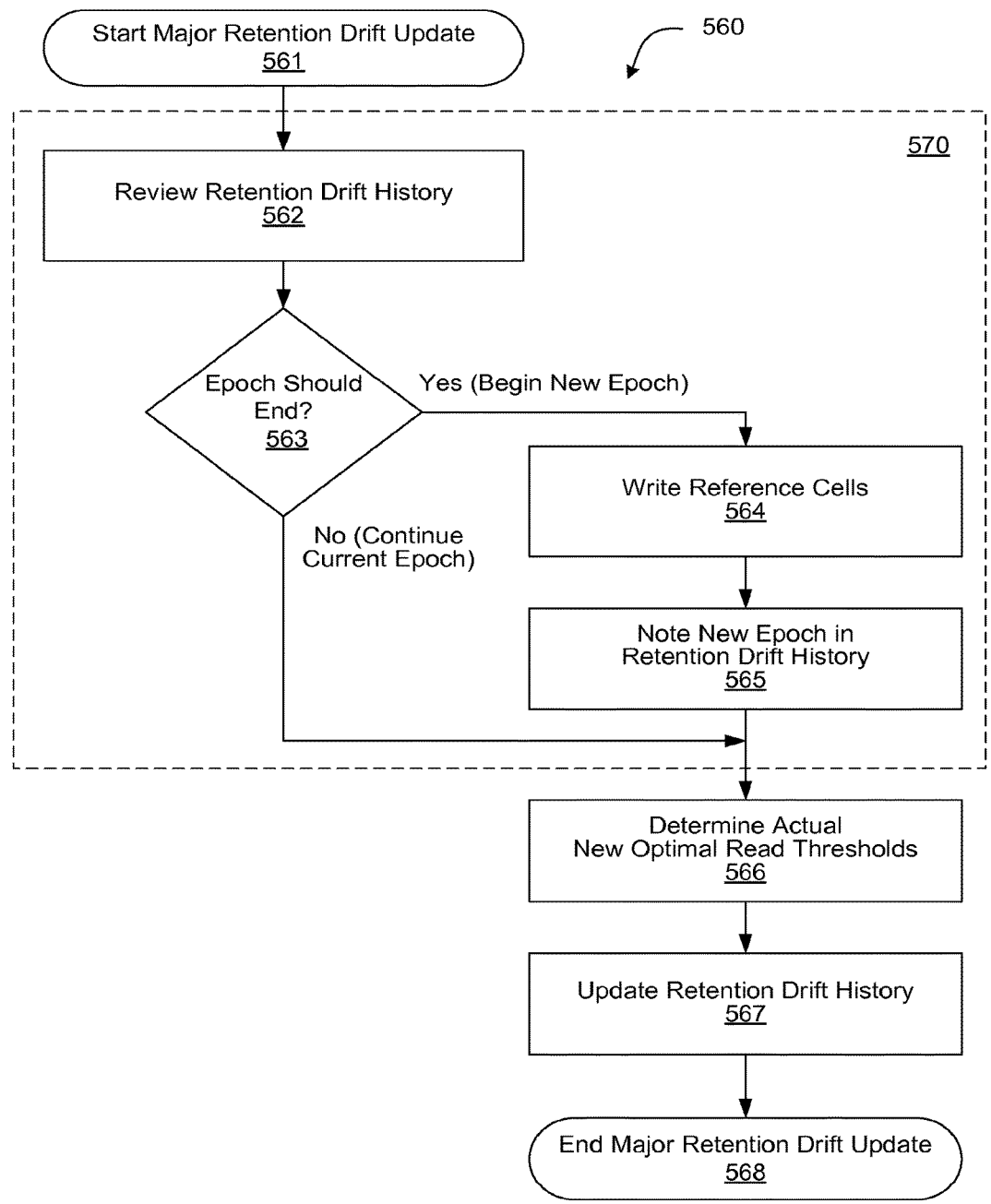

FIGS. 5B and 5C respectively illustrate flow diagrams of selected details of embodiments for Minor Retention Drift Update 540 and Major Retention Drift Update 560, components of Retention Drift Tracking 500. In FIG. 5B, Minor Retention Drift Update 540 includes optional Select Retention Drift Predictor/Scheme 553, Read Retention Drill History 554, and Predict New Optimal Read Thresholds Based on Retention Drill History 555. In such a Minor Retention Drift Update, the predicted values for the new optimal read threshold voltages are determined based on operations on the existing Retention Drift History data, using one or more Predictors (schemes, or algorithms) according to embodiment, but avoid more time consuming empirical evaluations (involving changes to and tests at, one or more test read threshold voltages) associated with a Major Retention Drift Update.

According to embodiment, the Retention Drift Predictor/Scheme may be fixed, programmable to a particular predictor/scheme among a plurality of same or selected dynamically in accordance with a predetermined criteria. A first predictor scheme includes a one-to-one function, wherein the normal use (non-reference) cells are predicted to behave identically to the reference cells. A second predictor scheme includes a time-based function, wherein the read threshold values obtained from the reference cells are modified in view of the retention drift history and the elapsed time once the reference cells were last written. A third predictor scheme includes a compensation function, wherein the read threshold values obtained from the reference cells are modified in view of characterization data according for differences between the normal use cells and the reference cells, including differences that are time and/or wear dependent. As a particular example, a compensating predictor is enabled to compensate based on a determination that normal use cells exhibit a different retention drift compared to the reference cells. In some embodiments, the variations between the reference cells and the normal use cells are more pronounced over time and/or wear, and/or the drift has a more-linear region and a less-linear region, and the compensating predictor compensates accordingly for all these scenarios. The predictor schemes are also generally combinable. That is, a single predictor module is enabled to perform one or more predictor schemes. According to embodiment, the compensation applied by the predictor includes a linear function with a time variable, a linear function without a time variable, a unity function, a non-linear function with a time variable, and a non-linear function without a time variable. In some embodiments having distributed reference cells, the predictor(s) additionally perform(s) averaging among the distributed reference cell blocks.

In FIG. 5C, Major Retention Drift Update 560 includes optional Implement Epochs 570, Determine Actual New Optimal Read Thresholds 566, and Update Retention Drift History 567. The determination of actual new optimal read thresholds in action 566 is performed in accordance with a predetermined method, generally using the same method used in action 502, as discussed previously. Once the actual new optimal read thresholds are determined, they are appended to the Retention Drift History in action 567.

In some embodiments, after sufficient time, and/or in combination with sufficient heat exposure, a determination is made as to whether the read thresholds in the reference cells have drifted more than is desirable (based on criteria that varies by embodiment) and should be reset (reinitialized: that is, rewritten). For example, in some NVM types, the read threshold drift is such that the page used to measure the reference read threshold level may become unusable (such as by all charge drifting away) after some amount of time passage and/or temperature excursion. In some embodiments, the reference cells are reinitialized after only a modest amount of drift, 0.3 V for example, so as to continue generally sampling the reference cells in a relatively linear region of voltage drift (with respect to time and/or temperature), and so as to avoid sampling the reference cells in a relatively more non-linear region of drift (with respect to time and/or temperature).

Such a reference cell reset event is viewed as defining a new generation or epoch. Optional Implement Epochs 570, includes Review Retention Drift History 562, followed by "Epoch Should End?" decision 563, which forks the control flow. Upon a "No (Continue Current Epoch)", control flow proceeds directly to action 566 (described previously). Otherwise, upon a "Yes (Begin New Epoch)" decision, Write Reference Cells action 564 and Note New Epoch in Retention Drift History action 565 are implemented before proceeding to action 566. By noting the new epoch (such as by incrementing an epoch count field of the retention drift history), the retention drift history before the change in epoch continues to contribute useful data points (and provide a more complete historical perspective), at least for example enabling a predictor to make a more accurate "curve fit" in assessing the current rate of change in the retention drift.

In some embodiments, the implementation of epochs is via a concatenation of an epoch (generation) number (in the most-significant bits) and the current reference read threshold level (in the least significant bits). In further embodiments, the reference read threshold level is mapped, such as with a mapping table, to linearize the retention drift (based on characterized knowledge of the nature/rate of the drift over time/temperature). The epoch number enables a succession of reference pages to be used, and/or the same reference page(s) to be reprogrammed (to return them close to the initial read threshold value, a.k.a. Vth0). This enables the reference drift clock to have an arbitrary range, as well as to optimally and/or selectively solely use a more linear region of the read threshold drift.

When each new block is programmed (or, in some embodiments, each new R-block), the new block is assigned the current read threshold value(s) predicted by the reference drift tracking. (In various embodiments wherein write data is striped across R-blocks, all blocks in an R-block are generally written at a same time with respect to the reference drift clock, and performing reference drill tracking on a per R-block basis consumes much less space than performing reference drift tracking on a per block basis.)

As another predictor example, in some embodiments, when a page in a block (or in an R-block) is later read, an updated nominal/current read threshold value for the read is determined, at least in part, as a function of (for example, a difference between, and/or other factors) the timestamp of the block (at the time the block was last written) and a current (freshly sampled) timestamp of the reference drift clock. (In some embodiments, upon determination that the elapsed "time" is small, a nominal read threshold value is used for the read, and there is no read threshold adjustment.) In this way, the nominal read threshold is properly compensated for time/temperature drift by use of the reference drift tracking (the reference drift clock).

Retention drift tracking reduces the number of read errors in a managed group of blocks by adjusting the current read thresholds as the device threshold voltage distributions shift (e.g. due to aging, and/or heat exposure). Reducing the number of errors improves performance, reduces power consumption, and/or improves the lifetime of an NVM. In some embodiments, retention drift tracking is performed in whole and/or incrementally when an SSD, any portions of NVM used in an SSD, or any portions of NVM used in any context, are idle, to reduce the impact on operations other than the retention drift tracking (e.g. accesses from a host, recycling, and/or map management).

Once the new operating read thresholds have been calculated, the current read thresholds are updated to the new operating read thresholds for the read and in the representative blocks, in action 530. In some embodiments, the current read thresholds for other (e.g. other than the representative) blocks within the managed group of blocks also updated to the calculated new operating read thresholds. In various embodiments, multiple representative blocks are selected for processing via retention drift tracking as a set, and the new operating read thresholds are averaged for the set to reduce block-to-block variation within a managed group of blocks.

In various embodiments, one or more operations (or portions thereof) illustrated in FIGS. 5A, 5B, and 5C are performed by and/or managed by an SSD controller (such as SSD Controller 100 of FIG. 1A) or elements thereof. For example, in some embodiments, one or more operations illustrated in FIGS. 5A, 5B, and 5C are implemented by and/or managed by firmware executed by CPU Core 172 of FIG. 1A. In various embodiments, one or more operations (or portions thereof) illustrated in FIGS. 5A, 5B, and 5C are performed by and/or managed by any one or more elements illustrated in FIG. 3. For example in some embodiments, determination of actual new optimal read thresholds (e.g. as performed by some embodiments of action 566) is performed at least in part via Balance Restoration Logic 380 of FIG. 3.

Figure 6A:
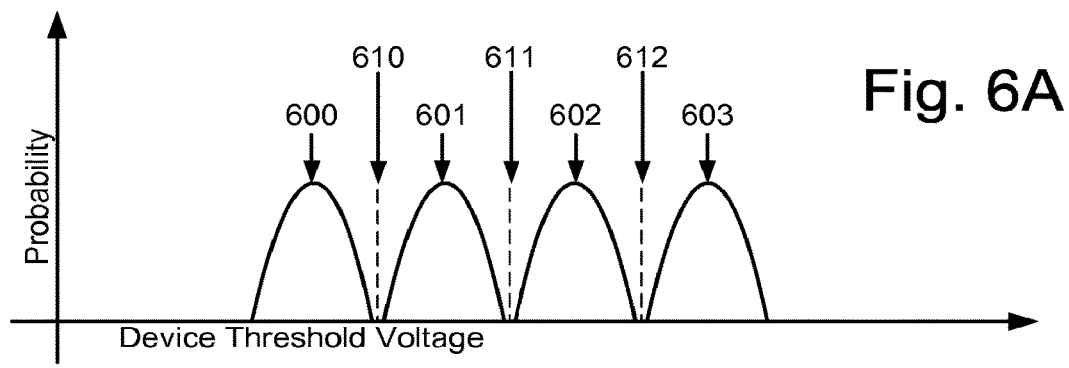
FIGS. 6A through 6C conceptually illustrate device threshold voltage distributions in a 4LC memory.
Figure 6B:
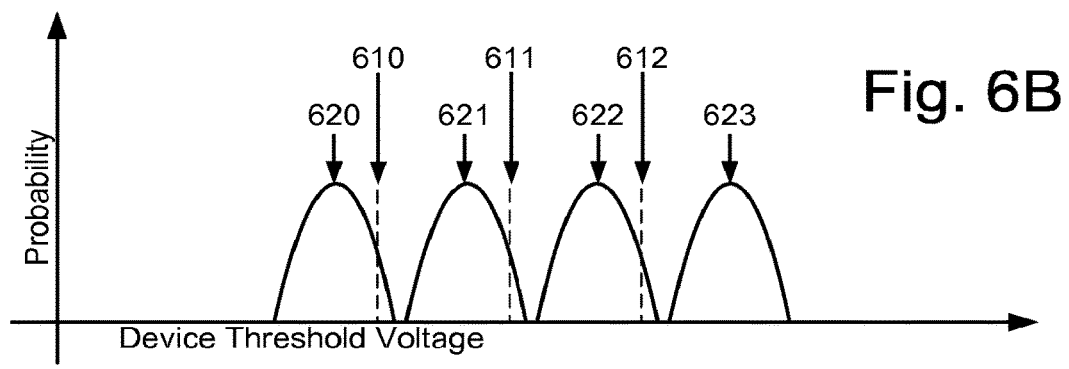
Figure 6C:
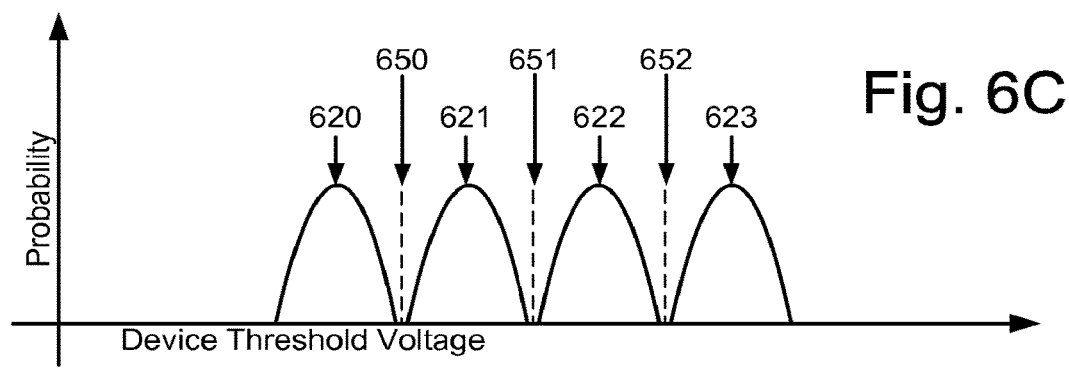

FIGS. 6A through 6C conceptually illustrate device threshold voltage distributions in a 4LC memory. For the purposes of this discussion as in FIGS. 2A through 2D, each hill-like bump is an abstraction for an independent Gaussian-like curve representing a device threshold voltage probability distribution for a respective state of a read unit sized portion of an NVM. The device threshold voltage axis is drawn with increasing positive voltage to the right. An absolute scale is purposefully not provided, and no reference points are identified, such that the plots apply more generally to a larger population of NVMs. FIG. 6A conceptually illustrates a 4LC memory that stores two bits per cell. There are four device threshold voltage distributions (E 600, D1 601, D2 602, and D3 603), with three current read thresholds ($V_{OLD1}$ 610, $V_{OLD2}$ 611, and $V_{OLD3}$ 612) that delineate the device threshold voltage distributions corresponding to the different states.

FIG. 6B conceptually illustrates a 4LC with shifted device threshold voltage distributions. There are four new device threshold voltage distributions (E' 620, D1' 621, D2' 622, and D3' 623). Note that the three current read thresholds no longer cleanly separate the new desire threshold voltage distributions. For example, some parts of D2' 622 lie to the right of $V_{OLD3}$ 612 and would be incorrectly identified.

FIG. 6C conceptually illustrates new operating read thresholds in 4LC with shifted device threshold voltage distributions. The new operating read thresholds $V_{NEW1}$ 650, $V_{NEW2}$ 651, and $V_{NEW3}$ 652 are calculated by the Retention Drift Tracking. Note that in contrast to the current read thresholds ($V_{OLD1}$, $V_{OLD2}$, and $V_{OLD3}$), the new operating read thresholds ($V_{NEW1}$, $V_{NEW2}$, and $V_{NEW3}$) cleanly separate the new device threshold voltage distributions, thus reducing the likelihood of a bit error and/or an uncorrectable (e.g., hard-decision decode) error. In various embodiments, FIG. 6C conceptually illustrates the new operating read thresholds from Update Current Read Thresholds 530.

Example Implementation Techniques

In some embodiments, various combinations of all or portions or operations performed by an SSD using optimization of read thresholds, e.g., with flash memories, a computing-host flash memory controller, and/or an SSD controller (such as SSD controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include; Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++ Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, in portions thereof.

Conclusion

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "comprises", "comprising", "includes", and "including" are specifically intended to be construed as abstractions describing logical sets of open-ended (nonrestrictive) scope and further are not meant to convey physical containment unless explicitly followed by the word "within".

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types: and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via same manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
selecting a retention drift predictor scheme for predicting optimal read threshold voltages in a non-volatile memory (NVM) from retention drift history;
reading the retention drift history associated with reference cells of a plurality of groups of pages of the NVM; and
predicting values for an optimal read threshold voltage of at least some of the plurality of groups of pages based at least on the selected retention drift predictor scheme and the read retention drift history.

2. The method of claim 1, wherein the retention drift predictor scheme is selected dynamically in accordance with a predetermined criteria.

3. The method of claim 1, wherein the retention drift predictor scheme comprises a one-to-one function, wherein non-reference cells of the plurality of groups of pages are predicted to behave identically to the reference cells.

4. The method of claim 1, wherein the retention drift predictor scheme comprises a time-based function, wherein read threshold values obtained from the reference cells are modified in view of the retention drift history and an elapsed time since the reference cells were last written.

5. The method of claim 1, wherein the retention drift predictor scheme comprises a compensation function, wherein read threshold values obtained from the reference cells are modified in view of characterization data accounting for differences between non-reference cells of the plurality of groups of pages and the reference cells.

6. The method of claim 5, wherein the differences between the non-reference cells and the reference cells further comprise differences that are time-dependent and wear-dependent.

7. The method of claim 1, further comprising compensating, by a compensating predictor, for variations between non-reference cells of the plurality of groups of pages and the reference cells based on a determination that the non-reference cells exhibit a different retention drift compared to the reference cells.

8. The method of claim 7, wherein the compensation applied by the compensating predictor comprises at least one of a linear function with a time variable, a linear function without a time variable, a unity function, a non-linear function with a time variable, and a non-linear function without a time variable.

9. A storage system comprising:
a non-volatile memory (NVM); and
a storage controller communicatively coupled to the NVM, the storage controller configured to
select a retention drift predictor scheme for predicting optimal read threshold voltages in the NVM from retention drift history;
read retention drift history associated with reference cells of a plurality of groups of pages of the NVM; and
predict values for an optimal read threshold voltage of at least some of the plurality of groups of pages based at least on the selected retention drift predictor scheme and the read retention drift history.

10. The storage system of claim 9, wherein the retention drift predictor scheme is selected dynamically in accordance with a predetermined criteria.

11. The storage system of claim 9, wherein the retention drift predictor scheme comprises a one-to-one function, wherein non-reference cells of the plurality of groups of pages are predicted to behave identically to the reference cells.

12. The storage system of claim 9, wherein the retention drift predictor scheme comprises a time-based function, wherein read threshold values obtained from the reference cells are modified in view of the retention drift history and an elapsed time since the reference cells were last written.

13. The storage system of claim 9, wherein the retention drift predictor scheme comprises a compensation function, wherein read threshold values obtained from the reference cells are modified in view of characterization data accounting for differences between non-reference cells of the plurality of groups of pages and the reference cells.

14. The storage system of claim 13, wherein the differences between the non-reference cells and the reference cells further comprise differences that are time-dependent and wear-dependent.

15. The storage system of claim 9, wherein the storage controller is further configured to compensate for variations between non-reference cells of the plurality of groups of pages and the reference cells based on a determination that the non-reference cells exhibit a different retention drift compared to the reference cells.

16. The storage system of claim 15, wherein the compensation applied by the storage controller comprises at least one of a linear function with a time variable, a linear function without a time variable, a unity function, a non-linear function with a time variable, and a non-linear function without a time variable.

17. A non-transitory computer readable storage medium having processor-executable instructions stored thereon that, when executed by a processor, cause the processor to:
    select a retention drift predictor scheme for predicting optimal read threshold voltages in a non-volatile memory (NVM) from retention drift history;
    read retention drift history associated with reference cells of a plurality of groups of pages of the NVM; and
    predict values for an optimal read threshold voltage of at least some of the plurality of groups of pages based at least on the selected retention drift predictor scheme and the read retention drift history.

18. The non-transitory computer readable storage medium of claim 17, wherein the retention drift predictor scheme comprises a compensation function, wherein read threshold values obtained from the reference cells are modified in view of characterization data accounting for differences between non-reference cells of the plurality of groups of pages and the reference cells.

19. The non-transitory computer readable storage medium of claim 17, wherein the processor is further configured to compensate for variations between non-reference cells of the plurality of groups of pages and the reference cells based on a determination that the non-reference cells exhibit a different retention drift compared to the reference cells.

20. The non-transitory computer readable storage medium of claim 19, wherein the compensation comprises at least one of a linear function with a time variable, a linear function without a time variable, a unity function, a non-linear function with a time variable, and a non-linear function without a time variable.

* * * * *